(12) United States Patent
Ramaswamy et al.

(10) Patent No.: US 12,453,145 B2
(45) Date of Patent: Oct. 21, 2025

(54) SINGLE GATED 3D NANOWIRE INVERTER FOR HIGH DENSITY THICK GATE SoC APPLICATIONS

(71) Applicant: Intel Corporation, Santa Clara, CA (US)

(72) Inventors: Rahul Ramaswamy, Portland, OR (US); Walid M. Hafez, Portland, OR (US); Tanuj Trivedi, Hillsboro, OR (US); Jeong Dong Kim, Scappoose, OR (US); Ting Chang, Portland, OR (US); Babak Fallahazad, Portland, OR (US); Hsu-Yu Chang, Hillsboro, OR (US); Nidhi Nidhi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 123 days.

(21) Appl. No.: 18/244,741

(22) Filed: Sep. 11, 2023

(65) Prior Publication Data
US 2023/0420501 A1 Dec. 28, 2023

Related U.S. Application Data

(63) Continuation of application No. 16/713,670, filed on Dec. 13, 2019, now Pat. No. 11,791,380.

(51) Int. Cl.
*H10D 62/10* (2025.01)
*H10D 30/62* (2025.01)
(Continued)

(52) U.S. Cl.
CPC ........... *H10D 62/119* (2025.01); *H10D 30/62* (2025.01); *H10D 30/6735* (2025.01);
(Continued)

(58) Field of Classification Search
CPC .... H10D 62/119; H10D 30/62; H10D 84/017; H10D 84/0193; H10D 84/853;
(Continued)

(56) References Cited

U.S. PATENT DOCUMENTS

2009/0057765 A1* 3/2009 Zhu ................... H10D 84/038
257/E21.409
2016/0379955 A1* 12/2016 Liu ...................... H01L 24/84
257/737
(Continued)

*Primary Examiner* — Fernando L Toledo
*Assistant Examiner* — Adam S Bowen
(74) *Attorney, Agent, or Firm* — Schwabe, Williamson & Wyatt, P.C.

(57) ABSTRACT

Embodiments disclosed herein include semiconductor devices and methods of forming such devices. In an embodiment, a semiconductor device comprises a substrate, and a first transistor of a first conductivity type over the substrate. In an embodiment, the first transistor comprises a first semiconductor channel, and a first gate electrode around the first semiconductor channel. In an embodiment, the semiconductor device further comprises a second transistor of a second conductivity type above the first transistor. The second transistor comprises a second semiconductor channel, and a second gate electrode around the second semiconductor channel. In an embodiment, the second gate electrode and the first gate electrode comprise different materials.

20 Claims, 16 Drawing Sheets

(51) Int. Cl.
*H10D 30/67* (2025.01)
*H10D 84/01* (2025.01)
*H10D 84/03* (2025.01)
*H10D 84/85* (2025.01)
*B82Y 10/00* (2011.01)
*B82Y 40/00* (2011.01)

(52) U.S. Cl.
CPC ....... *H10D 84/017* (2025.01); *H10D 84/0193* (2025.01); *H10D 84/038* (2025.01); *H10D 84/853* (2025.01); *B82Y 10/00* (2013.01); *B82Y 40/00* (2013.01)

(58) Field of Classification Search
CPC .. H10D 30/014; H10D 30/43; H10D 30/6757; H10D 62/121; H10D 64/017; H10D 62/116; H10D 62/822; H10D 84/0186; H10D 84/0167; H10D 84/0177; H10D 84/0181; H10D 84/85; H10D 88/00; H10D 88/01
See application file for complete search history.

(56) References Cited

U.S. PATENT DOCUMENTS

| | | | |
|---|---|---|---|
| 2019/0319095 A1* | 10/2019 | Zhang | H01L 21/02532 |
| 2020/0294866 A1* | 9/2020 | Cheng | H10D 30/6757 |

* cited by examiner

SINGLE GATED 3D NANOWIRE INVERTER FOR HIGH DENSITY THICK GATE SoC APPLICATIONS

CROSS-REFERENCE TO RELATED APPLICATIONS

This application is a continuation of U.S. patent application Ser. No. 16/713,670, filed on Dec. 13, 2019, the entire contents of which is hereby incorporated by reference herein.

TECHNICAL FIELD

Embodiments of the present disclosure relate to semiconductor devices, and more particularly to single gated nanowire inverters for high density thick gate SoC applications.

BACKGROUND

As integrated device manufacturers continue to shrink the feature sizes of transistor devices to achieve greater circuit density and higher performance, there is a need to manage transistor drive currents while reducing short-channel effects, parasitic capacitance, and off-state leakage in next-generation devices. Non-planar transistors, such as fin and nanowire-based devices, enable improved control of short channel effects. For example, in nanowire-based transistors the gate stack wraps around the full perimeter of the nanowire, enabling fuller depletion in the channel region, and reducing short-channel effects due to steeper sub-threshold current swing (SS) and smaller drain induced barrier lowering (DIBL).

In order to implement an inverter, a P-type transistor is electrically coupled to an N-type transistor. A circuit diagram of such an inverter 180 is shown in FIG. 1. The gates (G) of the P-type transistor and the N-type transistor are coupled together at the VIN terminal. The drains (D) of the P-type transistor and the N-type transistor are coupled together at the VOUT terminal. The source (S) of the P-type transistor is connected to the $V_{dd}$ voltage, and the source (S) of the N-type transistor is connected to ground.

In order to provide the desired functionality for the N-type and P-type transistors, separate gate electrodes are needed. That is, an N-type work function metal is needed for the N-type transistor, and a P-type work function metal is needed for the P-transistor. Accordingly, the N-type transistor and the P-type transistor need to occupy distinct footprints over the substrate. This is area intensive since the channel lengths needed for such transistors is relatively large (e.g., 100 nm or larger). Such a configuration also requires routing in the back end of line (BEOL) stack in order to electrically couple the gates (G) and drains (D).

EMBODIMENTS OF THE PRESENT DISCLOSURE

Figure 1:
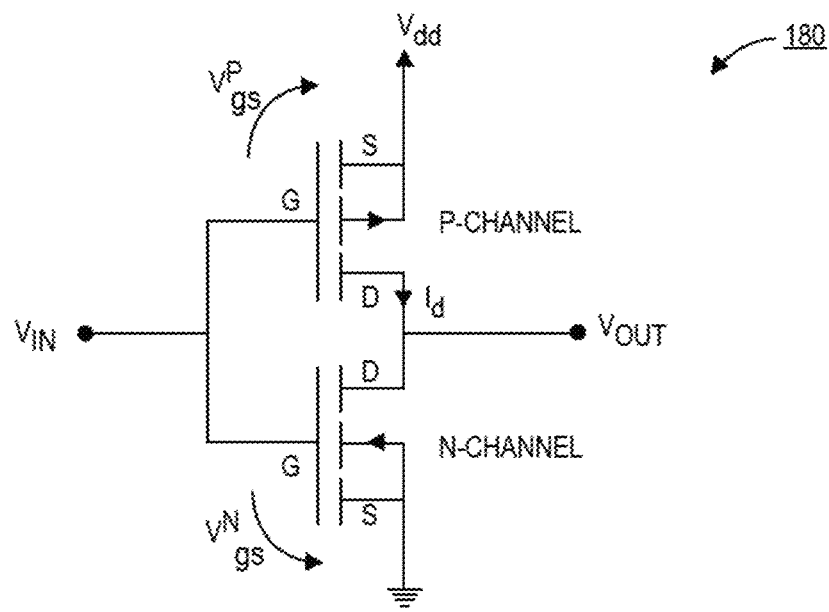
FIG. 1 is a schematic illustration of the circuit for an inverter.

Described herein are single gated nanowire inverters for high density thick gate SoC applications, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Nanoribbon devices are described in greater detail below. However, it is to be appreciated that substantially similar devices may be formed with nanowire channels. A nanowire device may include devices where the channel has a width dimension and a thickness dimension that are substantially similar, whereas a nanoribbon device may include a channel that has a width dimension that is substantially larger or substantially smaller than a thickness dimension. As used herein, "high-voltage" may refer to voltages of approximately 1.0 V or higher.

As noted above, existing inverter layouts require transistors with separate gate electrodes and distinct footprints. The N-type and P-type transistors are then electrically coupled together using BEOL routing. Such configurations are, therefore, area intensive and occupy valuable routing space above the transistors. Accordingly, embodiments disclosed herein provide an inverter that comprises stacked transistors. Such a configuration reduces the footprint on the substrate since the N-type and P-type channel regions are vertically stacked instead of being laterally adjacent to each other. Additionally, the stacked transistors can share a gate electrode, so there is no need for additional routing in the BEOL.

The stacked transistors can share a gate electrode by using a hybrid gate electrode. A hybrid gate electrode may comprises an N-type work function metal over the N-channels and a P-type work function metal over the P-channels. Routing complexity is further reduced due to the stacking of the source/drain regions. In an embodiment, one pair of stacked source/drain regions may be electrically coupled by a conducting layer and the other pair of stacked source/drain regions may be electrically isolated by an insulating layer.

Figure 2A:
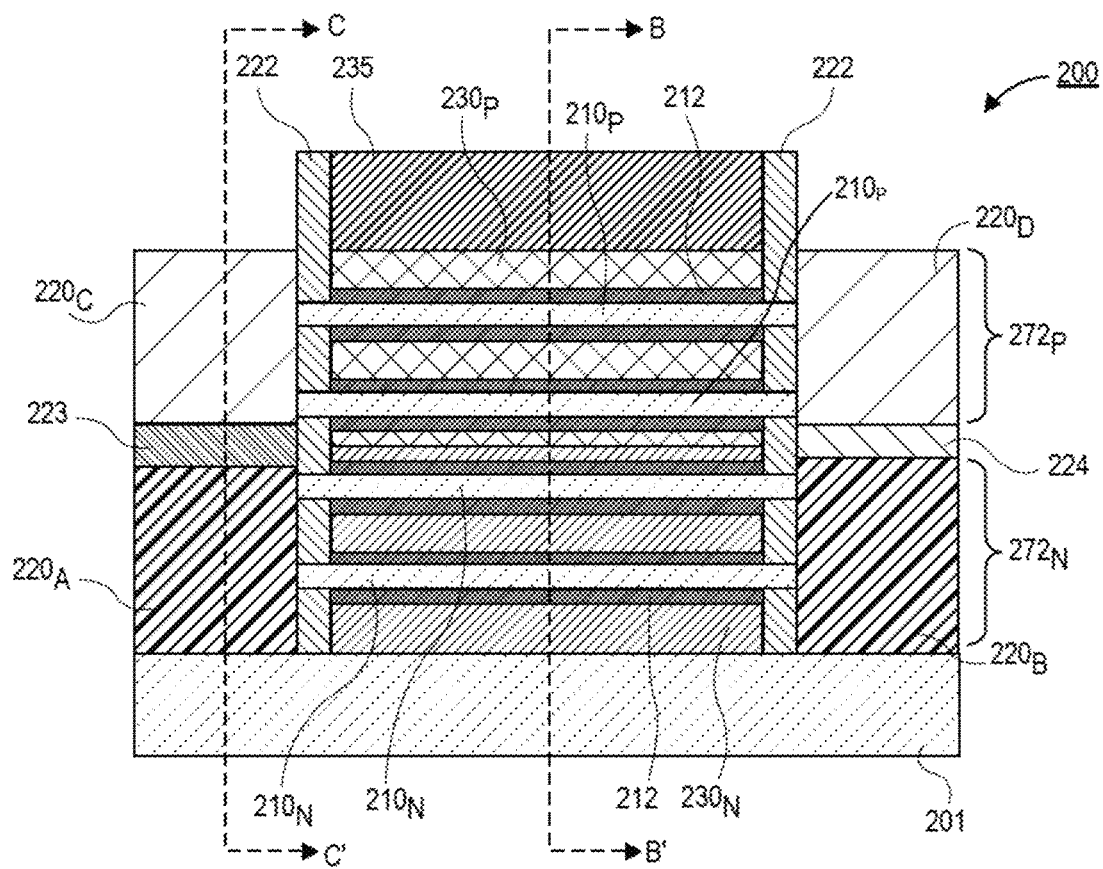
FIG. 2A is a cross-sectional illustration of stacked transistors electrically coupled together to function as an inverter, in accordance with an embodiment.

Referring now to FIG. 2A, a cross-sectional illustration of a semiconductor device 200 is shown, in accordance with an embodiment. In an embodiment, the semiconductor device 200 may be an inverter. That is, the semiconductor device 200 may comprise an N-type transistor $272_N$ and a P-type transistor $272_P$. In an embodiment, the N-type transistor $272_N$ and the P-type transistor $272_P$ are stacked in a vertical configuration with the P-type transistor $272_P$ being directly above the N-type transistor $272_N$. In other embodiments, the N-type transistor $272_N$ may be positioned over the P-type transistor $272_P$.

In an embodiment, the N-type transistor $272_N$ and the P-type transistor $272_P$ are disposed over a substrate 201. In an embodiment, the substrate 201, may include a semiconductor substrate and an isolation layer (not shown) over the semiconductor substrate 201. In an embodiment, the underlying semiconductor substrate 201 represents a general workpiece object used to manufacture integrated circuits. The semiconductor substrate 201 often includes a wafer or other piece of silicon or another semiconductor material. Suitable semiconductor substrates 201 include, but are not limited to, single crystal silicon, polycrystalline silicon and silicon on insulator (SOI), as well as similar substrates formed of other semiconductor materials, such as substrates including germanium, carbon, or group III-V materials.

In an embodiment, the N-type transistor $272_N$ and the P-type transistor $272_P$ are electrically coupled together. For example, a single gate electrode is used to control both the N-type transistor $272_N$ and the P-type transistor $272_P$. The semiconductor device 200 may comprise a hybrid gate electrode. The hybrid gate electrode includes a first gate electrode $230_N$ around the N-type channels $210_N$ and a second gate electrode $230_P$ around the P-type channels $210_P$. Accordingly, the work functions can be chosen to provide the needed threshold voltage for each conductivity type. In an embodiment, a first pair of source/drain regions (e.g., $220_A$ and $220_C$) are electrically isolated from each other by an insulating layer 223, and a second pair of source/drain regions (e.g., $220_B$ and $220_D$) are electrically coupled to each other by a conducting layer 224. Accordingly, the stacked transistors $272_P$ and $272_N$ may be electrically coupled together as an inverter, such as the inverter circuit 180 shown in FIG. 1.

In an embodiment, the N-type transistor $272_N$ comprises one or more semiconductor channels $210_N$. The semiconductor channels $210_N$ may comprise any suitable semiconductor materials. For example, the semiconductor channels $210_N$ may comprise silicon or group III-V materials. In an embodiment, the semiconductor channels $210_N$ may be surrounded by a gate dielectric 212. In an embodiment, the gate dielectric 212 may have any desired thickness. In a particular embodiment, the thickness of the gate dielectric 212 is approximately 3 nm or greater. In the illustrated embodiment, the gate dielectric 212 is shown as only being on the semiconductor channels $210_N$ and $210_P$. However, it is to be appreciated that the gate dielectric 212 may also be deposited along interior surfaces of the spacers 222 and/or over the top surface of the substrate 201 within the spacers 222.

In an embodiment, the material (or materials) chosen for the gate dielectric may be any suitable high dielectric constant materials. For example, the gate dielectric 212 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In an embodiment, the gate dielectric 212 may also be subject to an annealing process to improve performance.

In an embodiment, a gate electrode $230_N$ may surround the gate dielectric 212 and the semiconductor channels $210_N$. The gate electrode $230_N$ may be a metal with a work function tuned for N-type operation. For example, an N-type workfunction metal preferably has a workfunction that is between about 3.9 eV and about 4.2 eV. N-type materials that may be used to form the metal gate electrode $230_N$ include, but are not limited to, hafnium, zirconium, titanium, tantalum, aluminum, and metal carbides that include these elements, e.g., titanium carbide, zirconium carbide, tantalum carbide, hafnium carbide and aluminum carbide.

In an embodiment, the semiconductor channels $210_N$ may pass through the spacers 222. Source/drain regions $220_A$ and $220_B$ may be disposed on opposite ends of the semiconductor channels $210_N$ outside of the spacers 222. In an embodiment, the source/drain regions $220_A$ and $220_B$ may comprise an epitaxially grown semiconductor material. The source/drain regions $220_A$ and $220_B$ may comprise a silicon alloy. In some implementations, the source/drain regions $220_A$ and $220_B$ comprise a silicon alloy that may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. In other embodiments, the source/drain regions $220_A$ and $220_B$ may comprise alternative semiconductor materials (e.g., semiconductors comprising group III-V elements and alloys thereof) or conductive materials.

In an embodiment, the P-type transistor $272_P$ comprises one or more semiconductor channels $210_P$. The semiconductor channels $210_P$ may comprise any suitable semiconductor materials. For example, the semiconductor channels $210_P$ may comprise silicon or III-V group materials. In an embodiment, the semiconductor channels $210_P$ may comprise the same materials as the semiconductor channels $210_N$. In the illustrated embodiment, the P-type transistor $272_P$ and the N-type transistor $272_N$ both include two semiconductor channels 210. In some embodiments, the number of semiconductor channels 210 in the P-type transistor $272_P$ may be different than the number of semiconductor channels $210_N$ in the N-type transistor $272_N$.

In an embodiment, the semiconductor channels $210_P$ may be surrounded by the gate dielectric 212. In some embodiments, the gate dielectric 212 surrounding the semiconductor channels $210_P$ may be substantially similar to the gate dielectric 212 that surrounds the semiconductor channels $210_N$. In other embodiments, the gate dielectric 212 around the semiconductor channels $210_P$ may comprise different materials, different material thicknesses, or different material treatments (e.g., anneals, etc.) than the gate dielectric 212 around the semiconductor channels $210_N$.

In an embodiment, a gate electrode $230_P$ may surround the gate dielectric 212 and the semiconductor channels $210_P$.

The gate electrode $230_P$ may be a metal with a work function tuned for P-type operation. For example, a P-type workfunction metal preferably has a workfunction that is between about 4.9 eV and about 5.2 eV. P-type materials that may be used to form the metal gate electrode 230 include, but are not limited to, ruthenium, palladium, platinum, cobalt, nickel, and conductive metal oxides, e.g., ruthenium oxide. In an embodiment, a fill metal 235 (e.g., tungsten) may be disposed over workfunction metal.

As shown in FIG. 2A, the gate electrode 230 is in direct contact with the gate electrode $230_N$. Accordingly, the two gate electrodes 230 and $230_N$ are held at substantially the same voltage. In an embodiment, the interface between the gate electrode $230_P$ and gate electrode $230_N$ is positioned between the N-type semiconductor channels $210_N$ and the P-type semiconductor channels $210_P$. Particularly, the interface in FIG. 2A is between a topmost N-type semiconductor channel $210_N$ (i.e., the second channel from the bottom), and the bottommost P-type semiconductor channel 210 (i.e., the third channel from the bottom). Put a different way, all N-type semiconductor channels $210_N$ are entirely surrounded by the N-type gate electrode $230_N$ and all P-type semiconductor channels $210_P$ are entirely surrounded by the P-type gate electrode $230_P$. In some instances, reference may be made to a "hybrid gate electrode". A hybrid gate electrode refers to the combination of the P-type gate electrode $230_P$ and the N-type gate electrode $230_N$ (with or without a fill metal 235).

In an embodiment, the semiconductor channels $210_P$ may pass through the spacers 222. Source/drain regions $220_C$ and $220_D$ may be disposed on opposite ends of the semiconductor channels $210_P$ outside of the spacers 222. In an embodiment, the source/drain regions $220_C$ and $220_D$ may comprise an epitaxially grown semiconductor material, such as those described above with respect to source/drain regions $220_A$ and $220_B$. The source/drain regions $220_C$ and $220_D$ may be the same base material as the source/drain regions $220_A$ and $220_B$, but have different dopants to provide the different conductivity type. In other embodiments, source/drain regions $220_C$ and $220_D$ may have a different base material than the source/drain regions $220_A$ and $220_B$.

In order to provide the desired electrical coupling between the N-type transistor $272_N$ and the P-type transistor $272_P$, interface layers may be provided between the stacked source/drain regions 220. For example, an insulating layer 223 may be positioned between the source/drain region $220_A$ and the source/drain region $220_C$. The insulating layer 223 may comprise an oxide, a nitride or any other insulating material. As such, the source/drain region $220_A$ may be held at a different potential than the source/drain region $220_C$. In contrast, a conducting layer 224 may be positioned between the source/drain region $220_B$ and the source/drain region $220_D$. The conducting layer 224 may comprise a conductive material, such as TiN or the like. As such, the source/drain region $220_B$ may be controlled to be substantially the same potential as the source/drain region $220_D$.

Figure 2B:
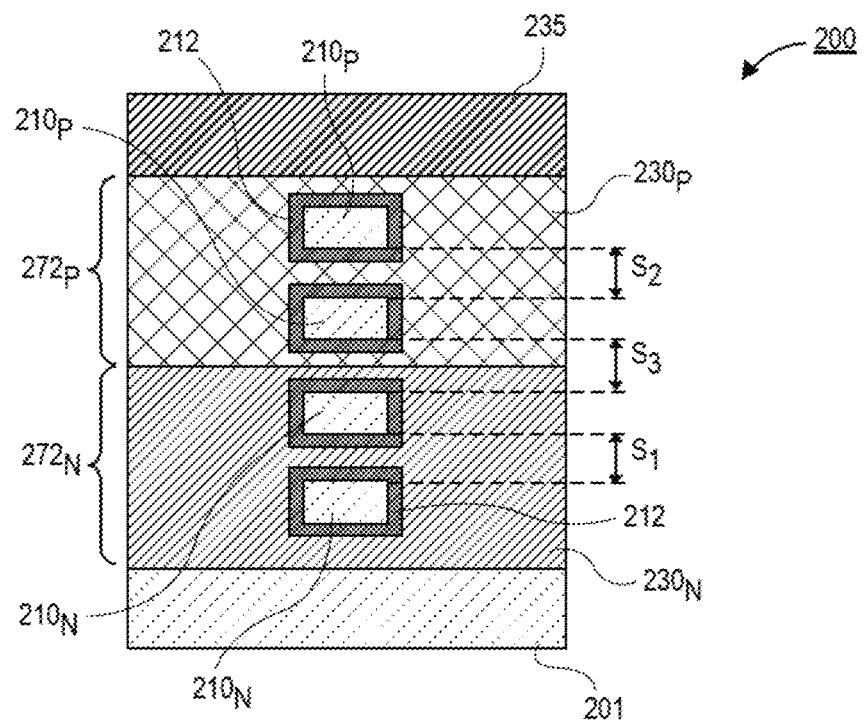
FIG. 2B is a cross-sectional illustration along line B-B' in FIG. 2A, in accordance with an embodiment.

Referring now to FIG. 2B, a cross-sectional illustration of the semiconductor device 200 along line B-B' in FIG. 2A is shown, in accordance with an embodiment. The cross-sectional view in FIG. 2B is across the channel region. As shown, the semiconductor channels 210 are rectangular shaped. The channels 210 may be referred to as nanoribbon channels 210. In other embodiments, nanowire channels 210 may also be used. As shown, each of the N-type semiconductor channels $210_N$ are completely surrounded by the N-type gate electrode $230_N$, and each of the P-type semiconductor channels $210_P$ are completely surrounded by the P-type gate electrode $230_P$.

In an embodiment, the semiconductor channels 210 may have any spacing between them. The N-type semiconductor channels $210_N$ are spaced at a first spacing $S_1$, the P-type semiconductor channels $210_P$ are spaced at a second spacing $S_2$, and the spacing between the P-type semiconductor channels $210_P$ and the N-type semiconductor channels $210_N$ is a third spacing $S_3$. In an embodiment, each of the first spacing $S_1$, the second spacing $S_2$, and the third spacing $S_3$ may be substantially similar to each other. In an embodiment, the spacings $S_{1-3}$ may be approximately 6 nm or greater.

Figure 2C:
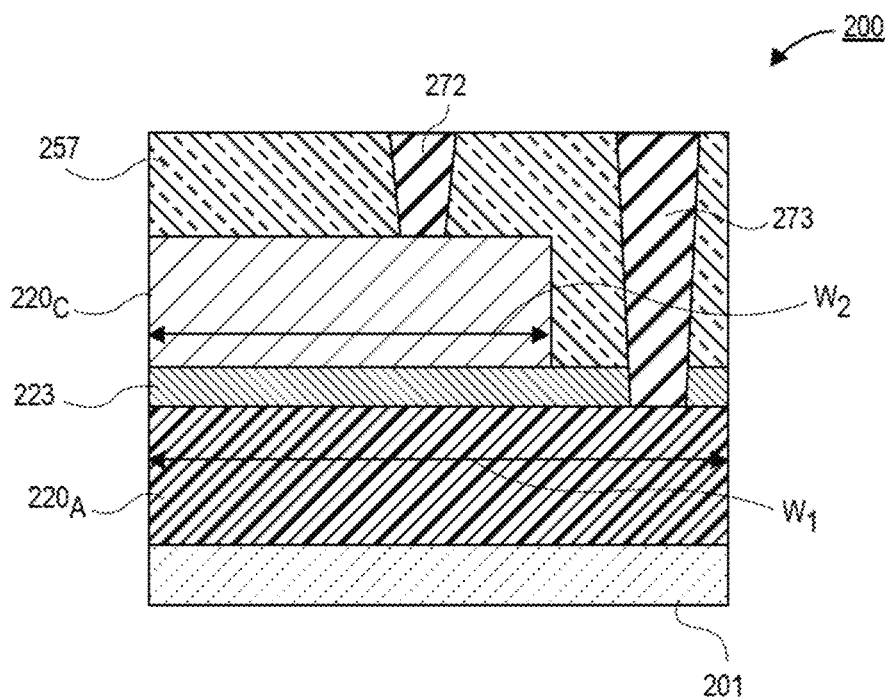
FIG. 2C is a cross-sectional illustration along line C-C' in FIG. 2A that illustrates a connection scheme, in accordance with an embodiment.

Referring now to FIG. 2C, a cross-sectional illustration of the semiconductor device 200 along line C-C' in FIG. 2A is shown, in accordance with an embodiment. The view illustrated in FIG. 2C depicts a connection architecture that may be used to provide an electrical contact to the buried source/drain region $220_A$. As shown, the source/drain region $220_A$ may have a first width $W_1$ that is greater than the second width $W_2$ of the source/drain region $220_C$. A first via 272 may drop through an insulating layer 257 to the source/drain region $220_C$, and a second via 273 may drop through the insulating layer 257 to the source/drain region $220_A$. That is, portions of the second via 273 may be laterally adjacent to the source/drain region $220_C$.

Figure 2D:
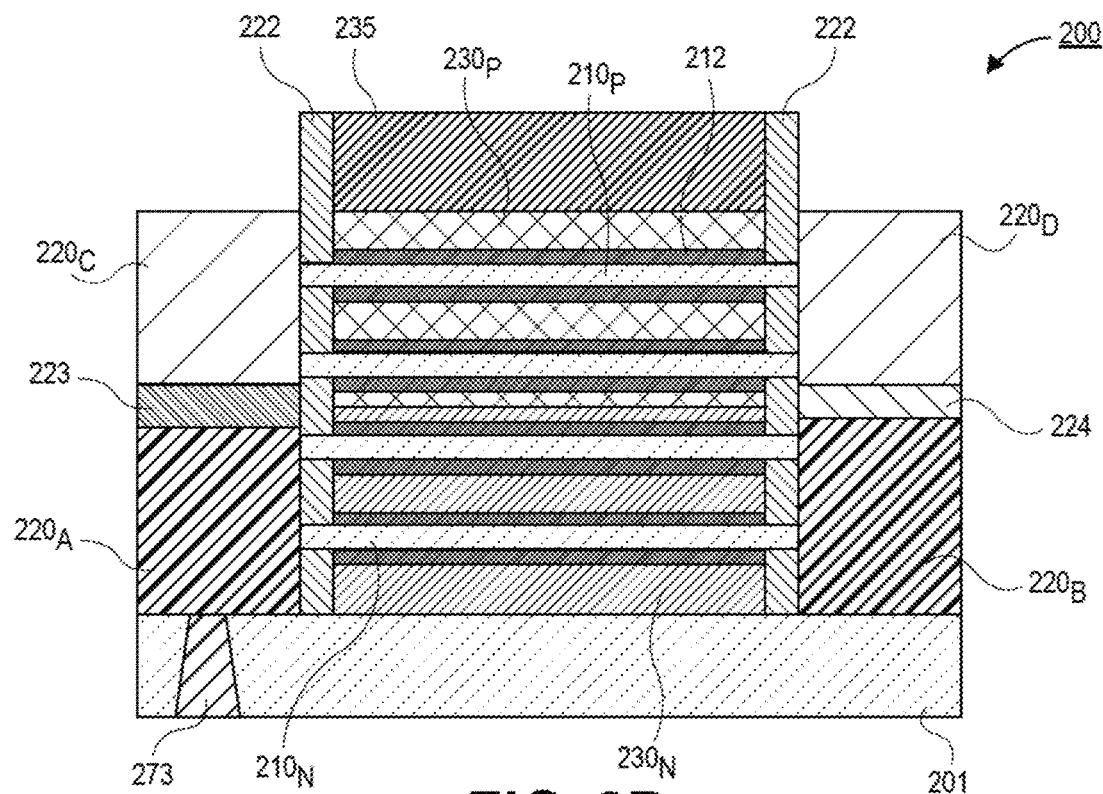
FIG. 2D is a cross-sectional illustration of stacked transistors with an alternative connection scheme, in accordance with an embodiment.

Referring now to FIG. 2D, a cross-sectional illustration of a semiconductor device 200 is shown, in accordance with an additional embodiment. In an embodiment, the semiconductor device 200 is substantially similar to the semiconductor device 200 in FIG. 2A, with the exception that a connection architecture to the buried source/drain region $220_A$ is different. Instead of contacting source/drain region $220_A$ from above, the second via 273 passes through the substrate 201. That is, the electrical connection to the source/drain region $220_A$ may be made from below in some embodiments.

Figure 2E:
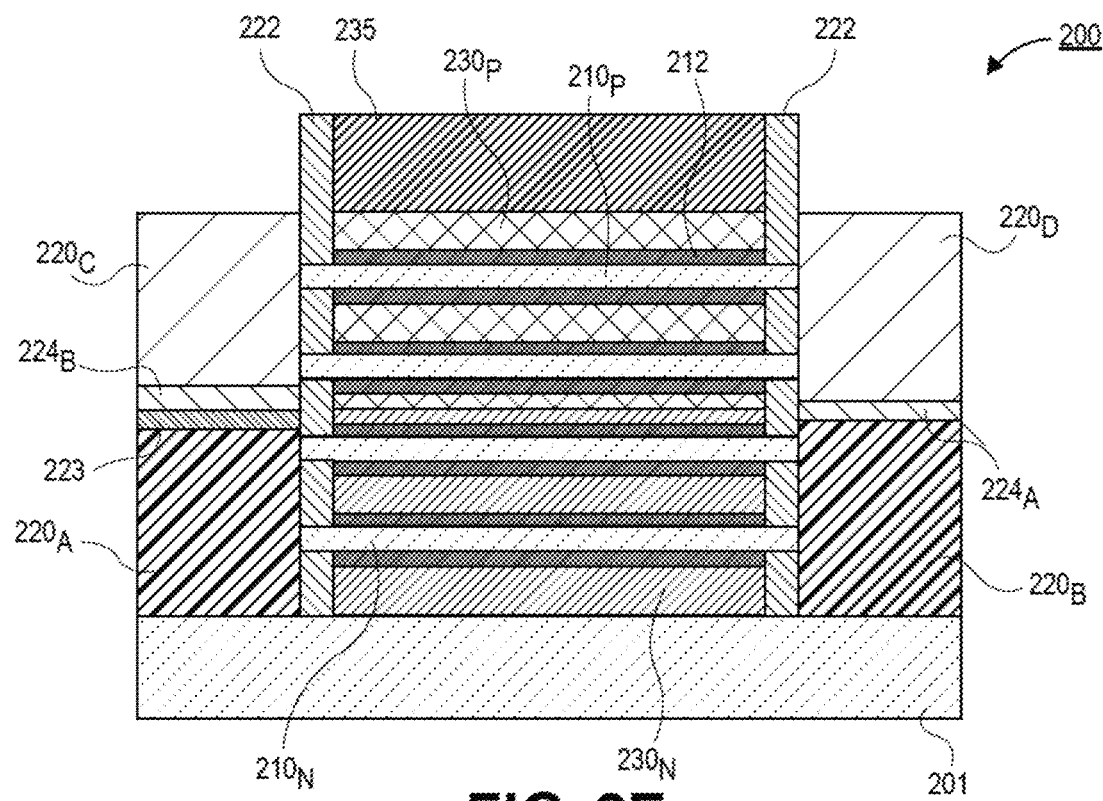
FIG. 2E is a cross-sectional illustration of a pair of stacked transistors electrically coupled together to function as an inverter, in accordance with an additional embodiment.

Referring now to FIG. 2E, a cross-sectional illustration of a semiconductor device 200 is shown, in accordance with an additional embodiment. The semiconductor device 200 in FIG. 2E is substantially similar to the semiconductor device 200 in FIG. 2A, with the exception that there are two conducting layers $224_A$ and $224_B$. The conducting layer $224_A$ is positioned between the source/drain region $220_B$ and the source/drain region $220_D$, similar to in FIG. 2A. However, a second conducting layer $224_B$ is disposed between the insulating layer 223 and the source/drain region $220_C$. Due to the presence of the insulating layer 223, the second conducting layer $224_B$ does not provide any electrical coupling to the underlying source/drain region $220_A$.

The second conducting layer $224_B$ may be a remnant of the processing operations used to fabricate the semiconductor device 200, as will be described in greater detail below. Particularly, the second conducting layer $224_B$ is deposited with the same deposition process used to deposit the first conducting layer $224_A$. As such, the material of the second conducting layer $224_B$ may be the same as the first conducting layer $224_A$. Additionally, a thickness of the second conducting layer $224_B$ may be the same as a thickness of the first conducting layer $224_A$. One difference between the second conducting layer $224_B$ and the first conducting layer $224_A$ that may be observed is in their Z-positions. For example, a bottom surface of the second conducting layer $224_B$ may be further from the substrate 201 than a bottom surface of the first conducting layer $224_A$. This is because the first conducting layer $224_A$ is directly over the source/drain region $220_B$, whereas the second conducting layer $224_B$ is separated from the source/drain region $220_A$ by the insulating layer 223.

Figure 2F:
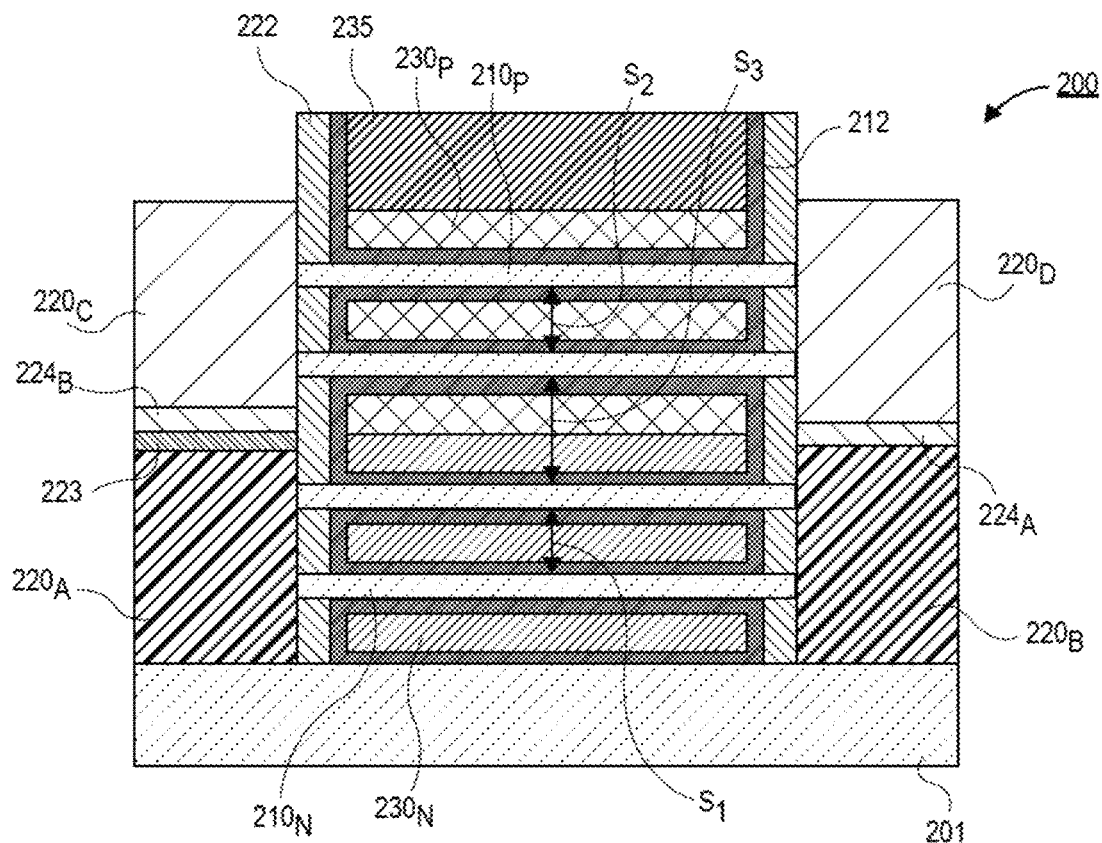
FIG. 2F is a cross-sectional illustration of a pair of stacked transistors electrically coupled together to function as an inverter, in accordance with an additional embodiment.

Referring now to FIG. 2F, a cross-sectional illustration of a semiconductor device 200 is shown, in accordance with an additional embodiment. In an embodiment, the semiconductor device 200 may be substantially similar to the semiconductor device 200 in FIG. 2E, with the exception of there being different spacings $S_{1-3}$. For example, the first spacing $S_1$ and the second spacing $S_2$ may be substantially similar to each other, and the third spacing $S_3$ may be larger than the first spacing $S_1$ and the second spacing $S_2$. Increasing the spacing $S_3$ provides additional room between the P-type semiconductor channels $210_P$ and the N-type semiconductor channels $210_N$. Therefore, larger margins with respect to the positioning of the interface between the N-type gate electrode $230_N$ and the P-type gate electrode 230 are provided. This provides a more reliable device, since it is easier to construct the hybrid gate electrode with the N-type gate electrode $230_N$ surrounding all of the N-type semiconductor channels $210_N$ and the P-type gate electrode 230 surrounding all of the P-type semiconductor channels $210_P$.

The semiconductor device 200 in FIG. 2F also differs from the semiconductor device 200 in FIG. 2E with respect to the gate dielectric 212. The gate dielectric 212 provides an example of a gate dielectric 212 that is deposited (e.g., with an atomic layer deposition (ALD) process). As such, the gate dielectric 212 may be disposed along interior surfaces of the spacers 222 and over the substrate 201 in addition to being disposed over the semiconductor channels 210. Such a configuration for the gate dielectric 212 may be applied to any of the other embodiments disclosed herein.

Figure 3A:
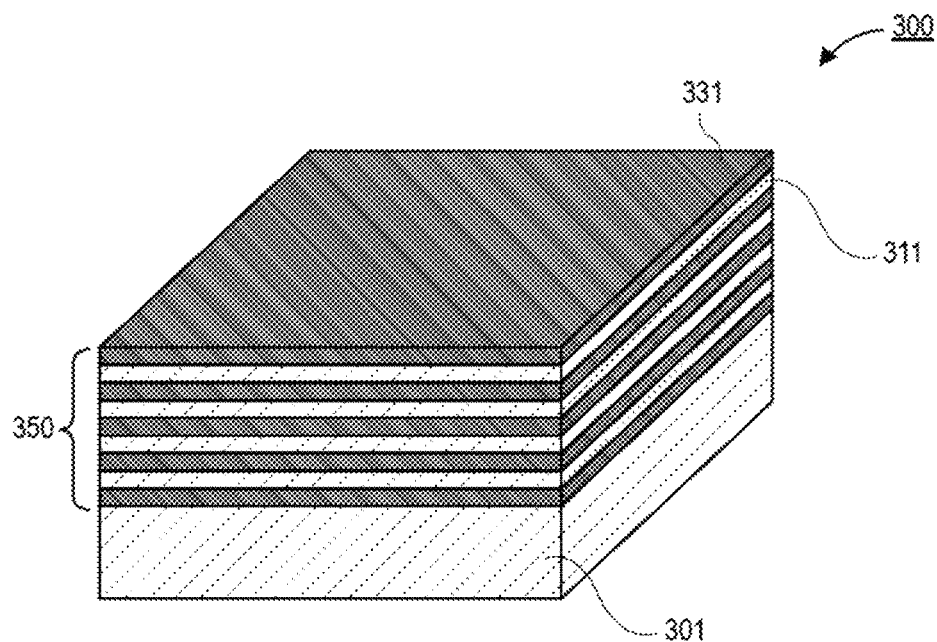
FIGS. 3A-3U are illustrations depicting a process for forming an inverter with a stacked transistor configuration, in accordance with an embodiment.
Figure 3B:
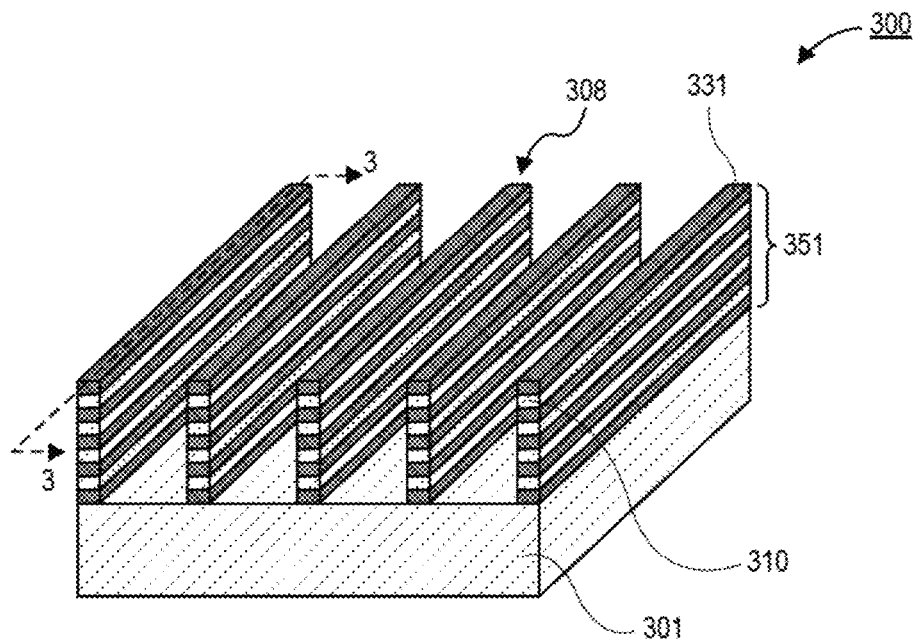
Figure 3C:
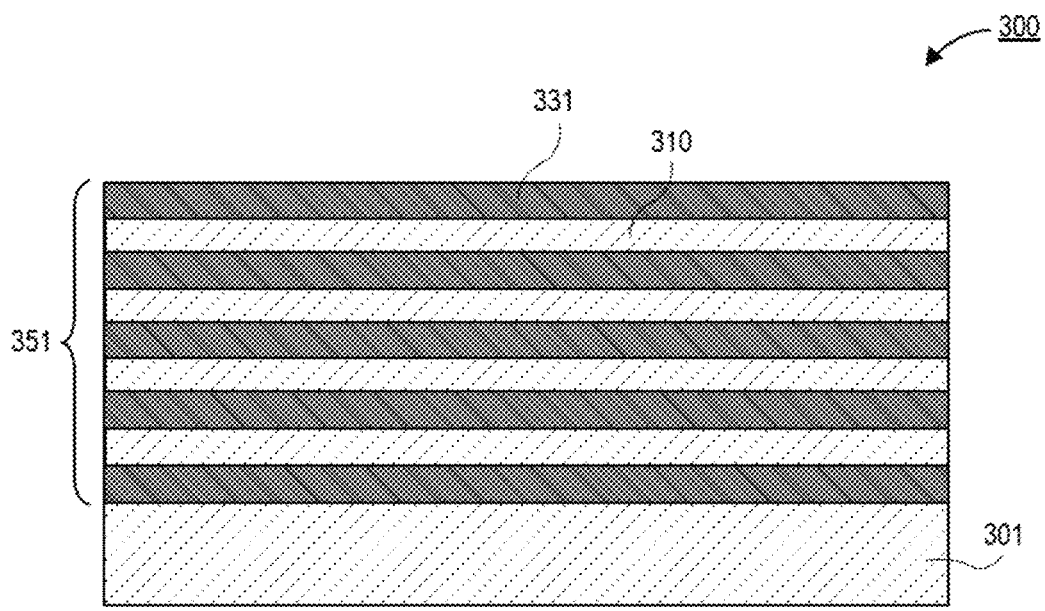
Figure 3D:
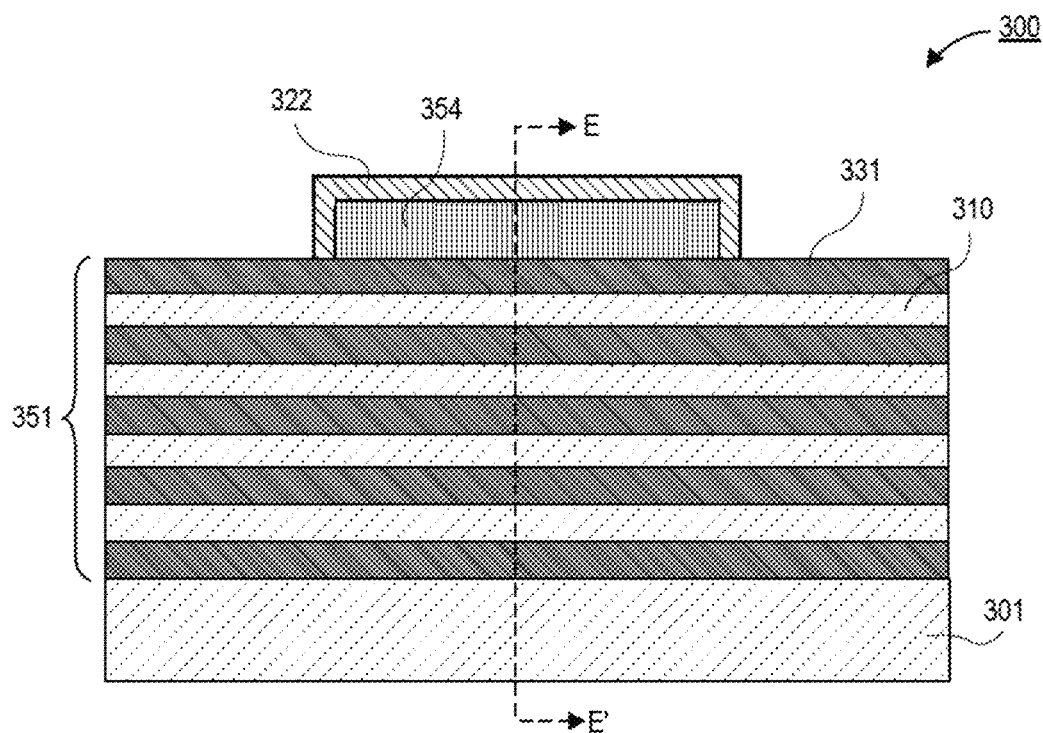
Figure 3E:
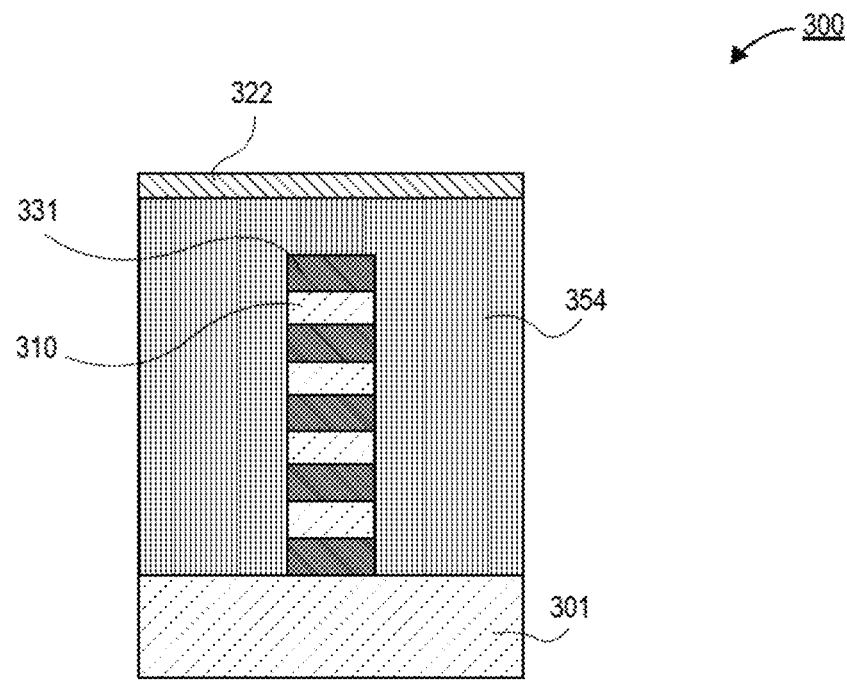
Figure 3F:
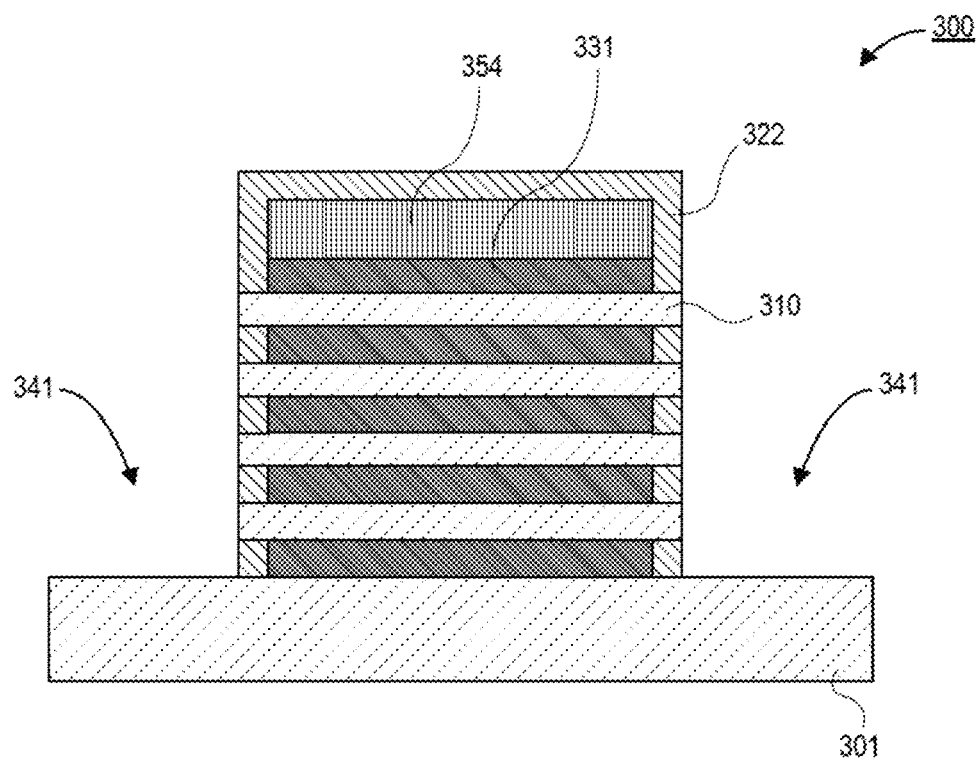
Figure 3G:
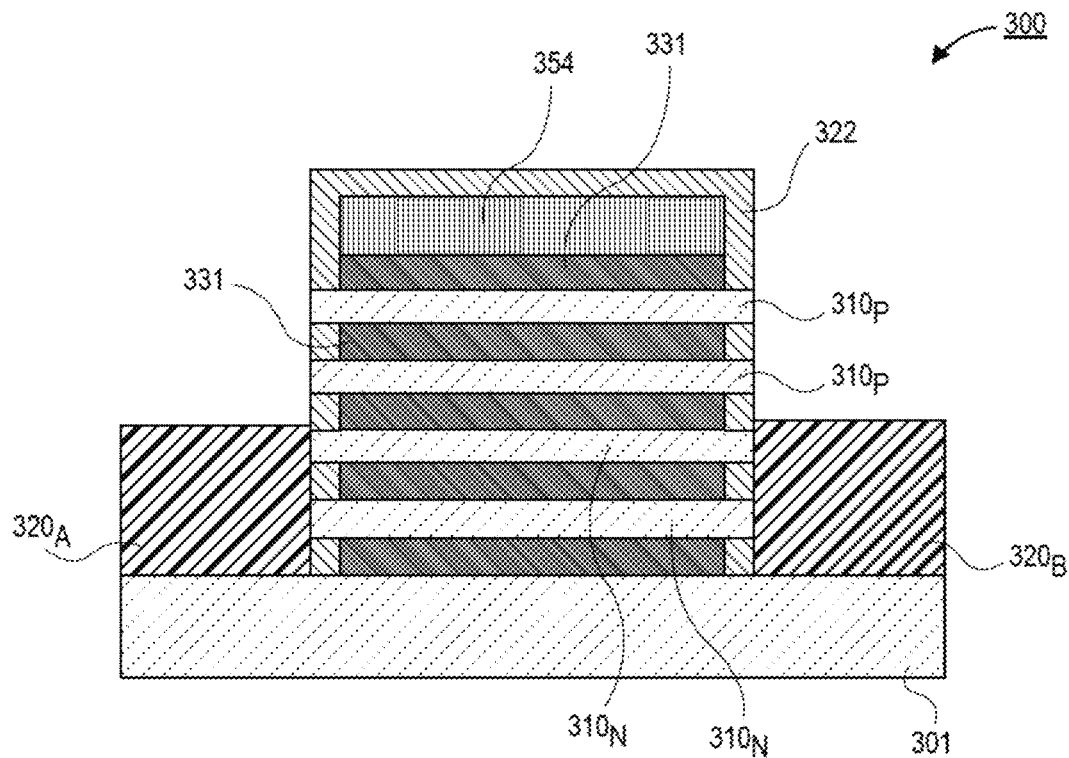
Figure 3H:
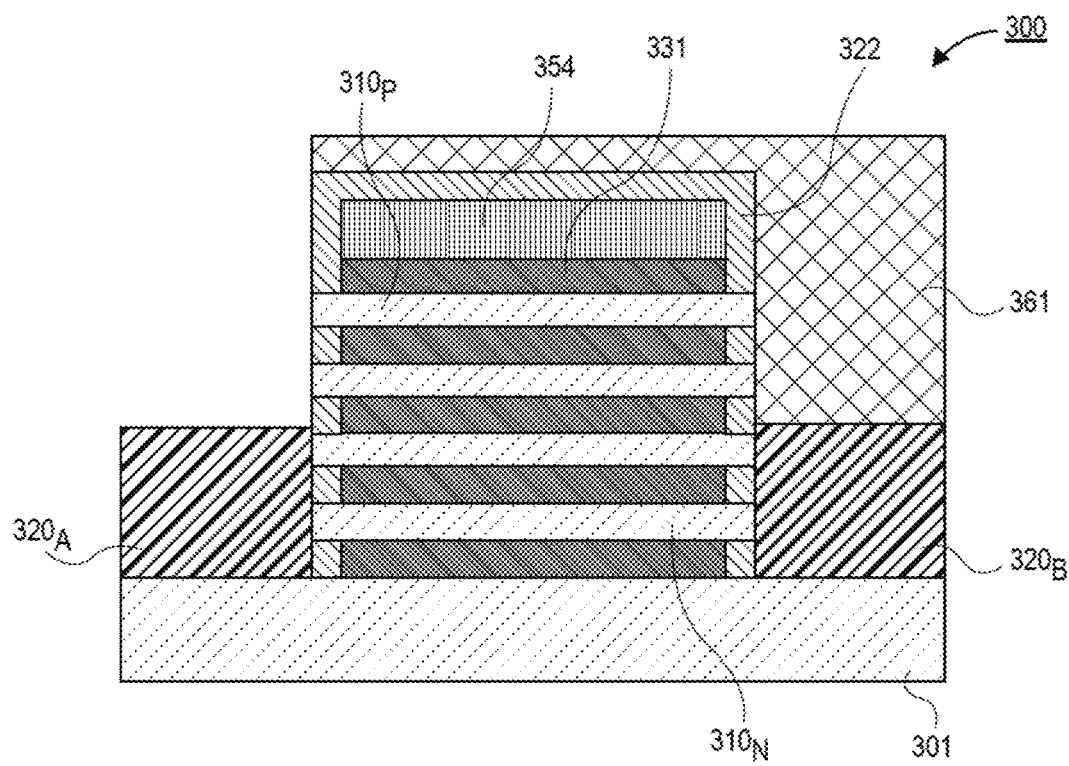
Figure 3I:
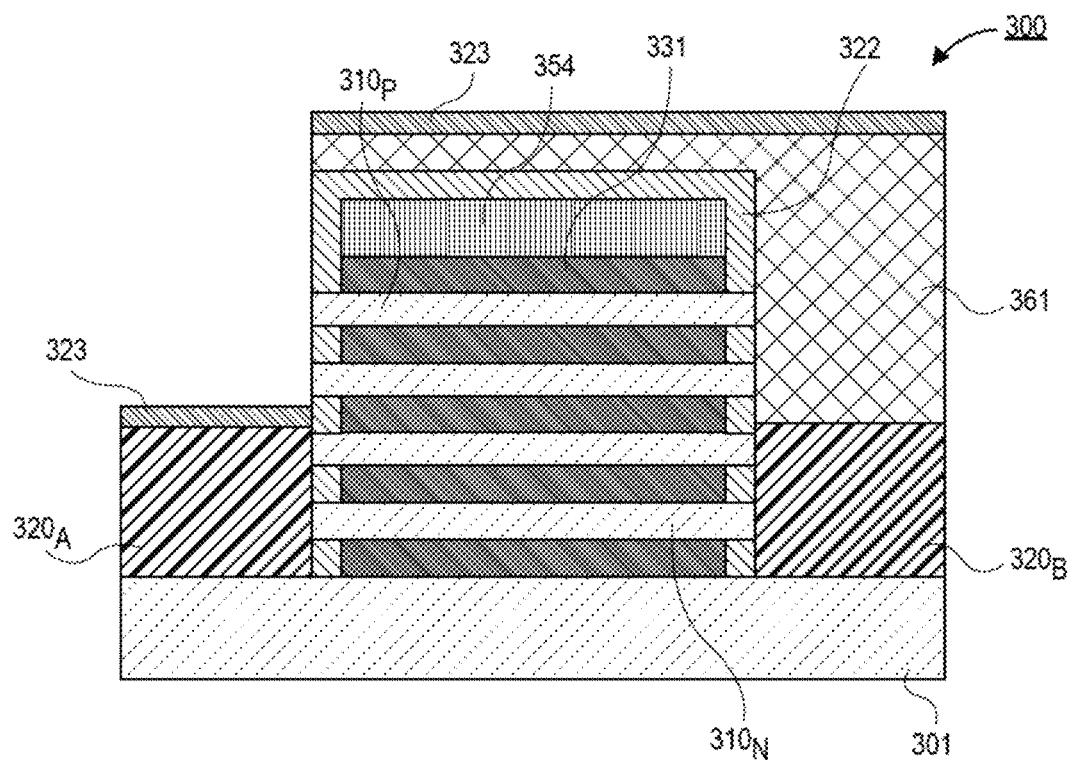
Figure 3J:
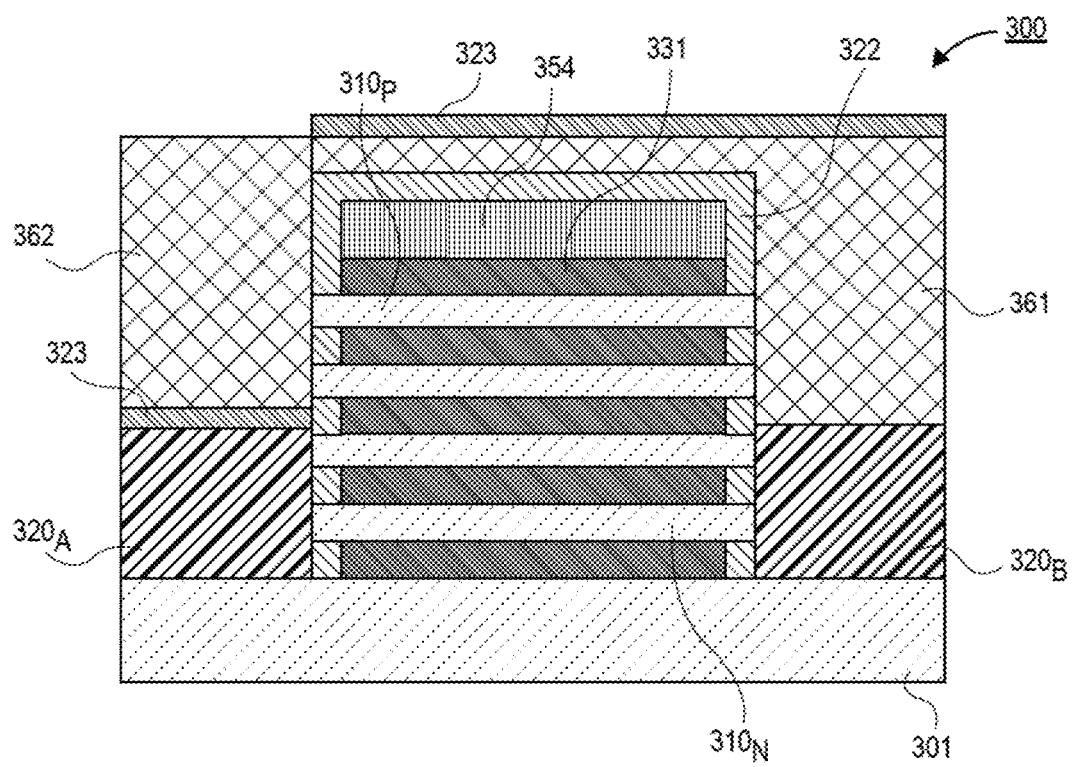
Figure 3K:
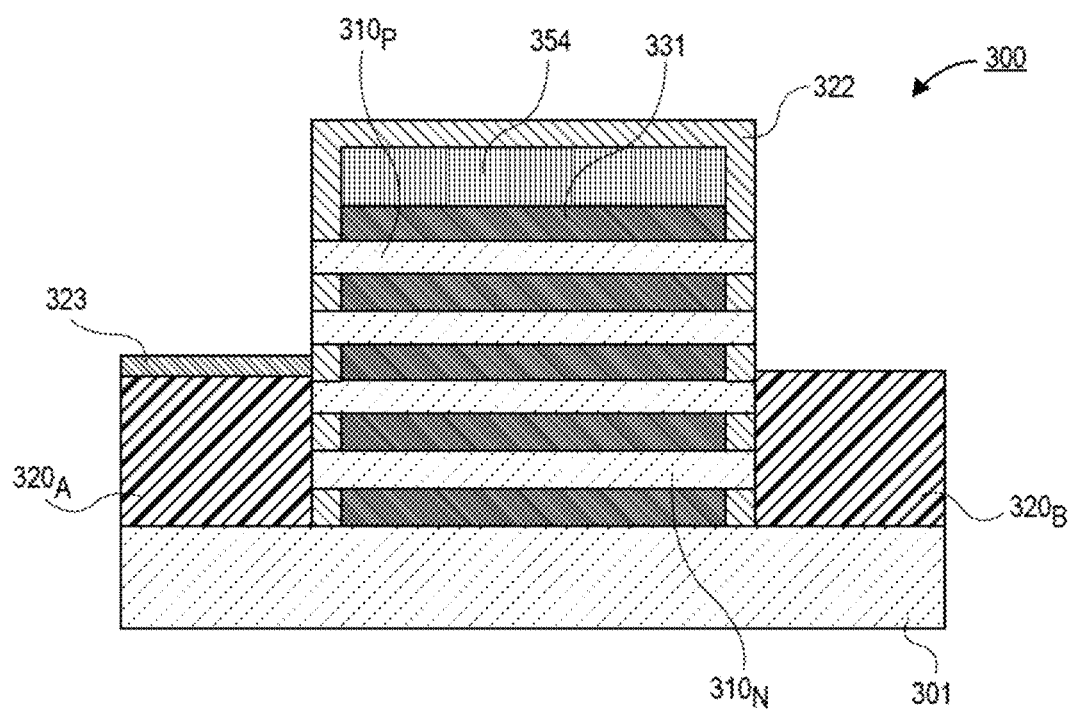
Figure 3L:
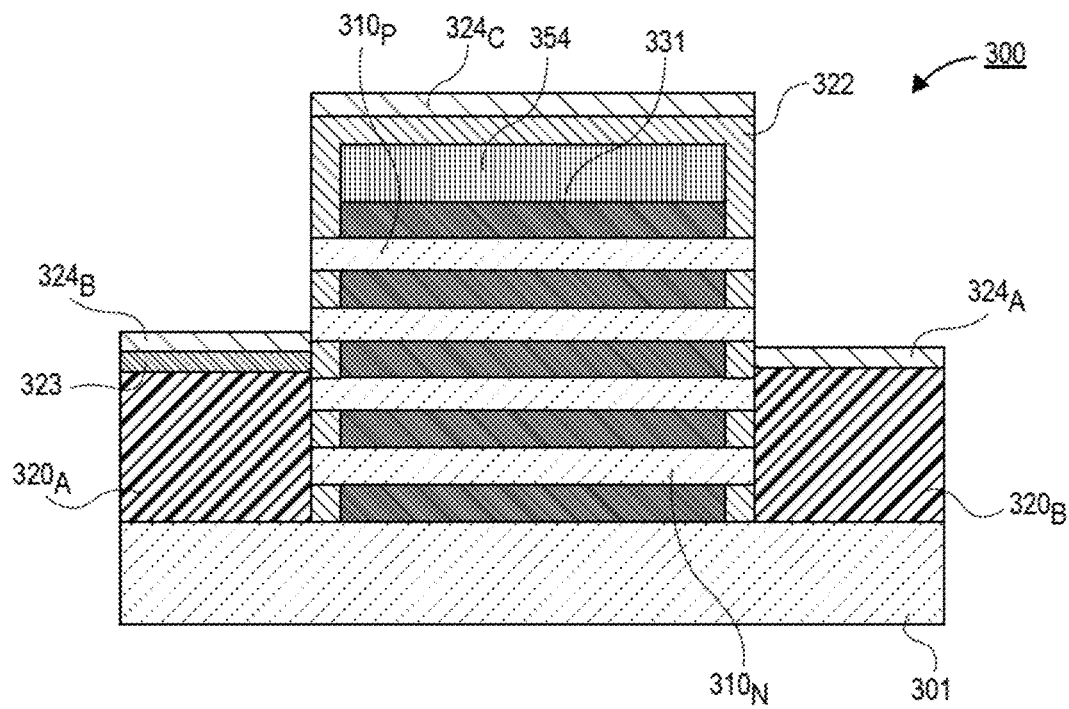
Figure 3M:
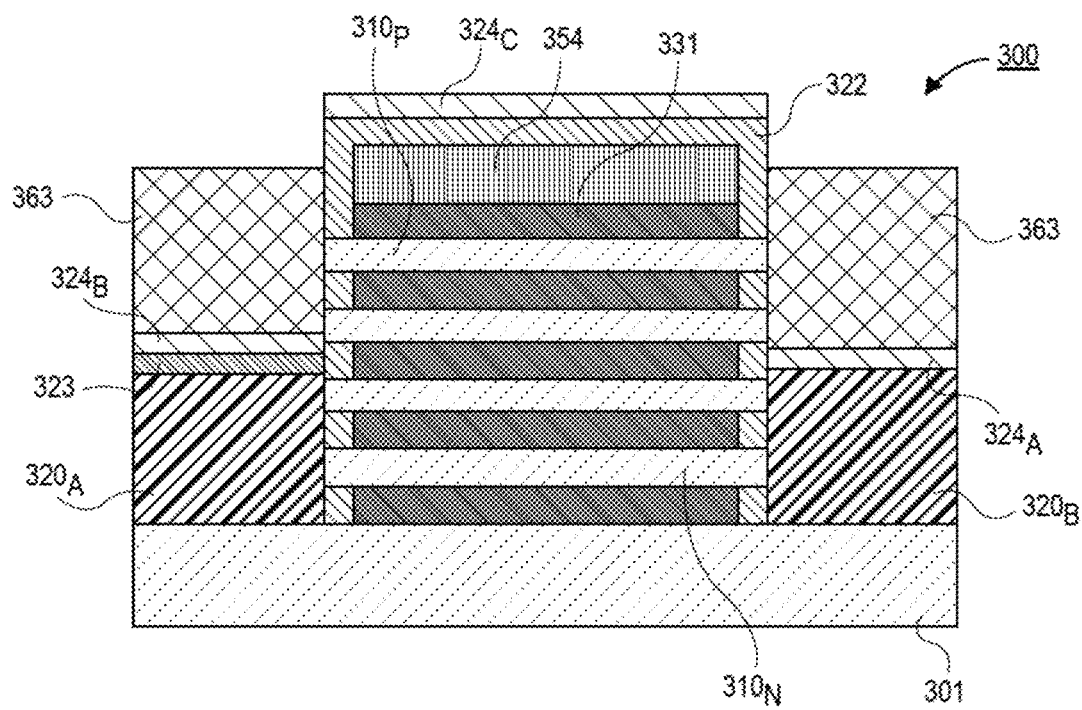
Figure 3N:
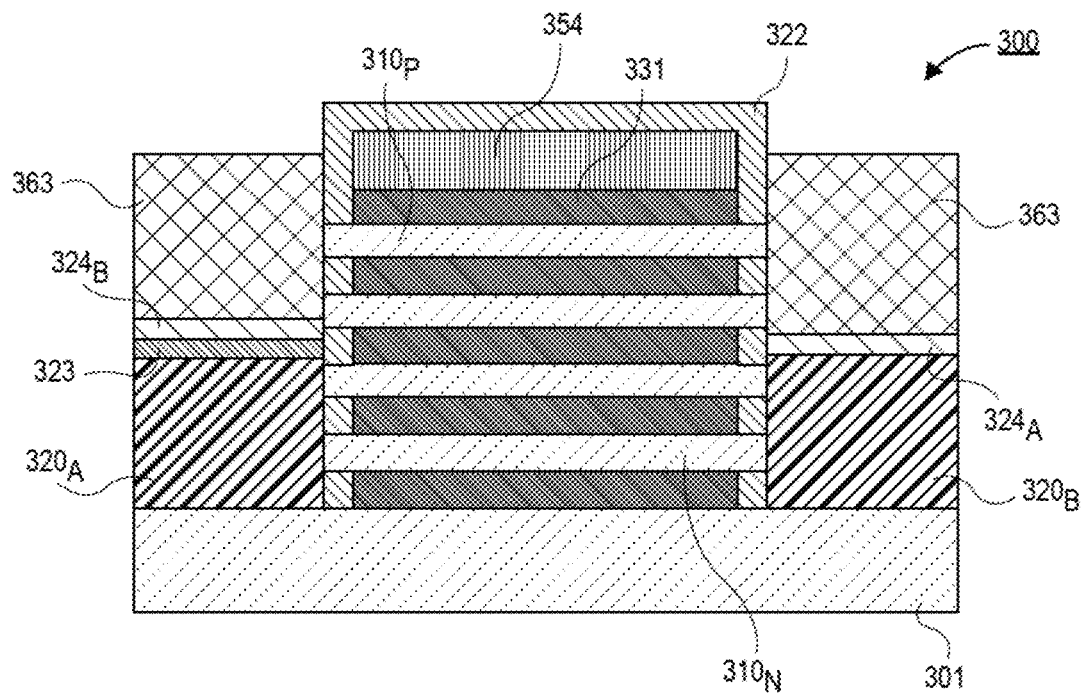
Figure 3O:
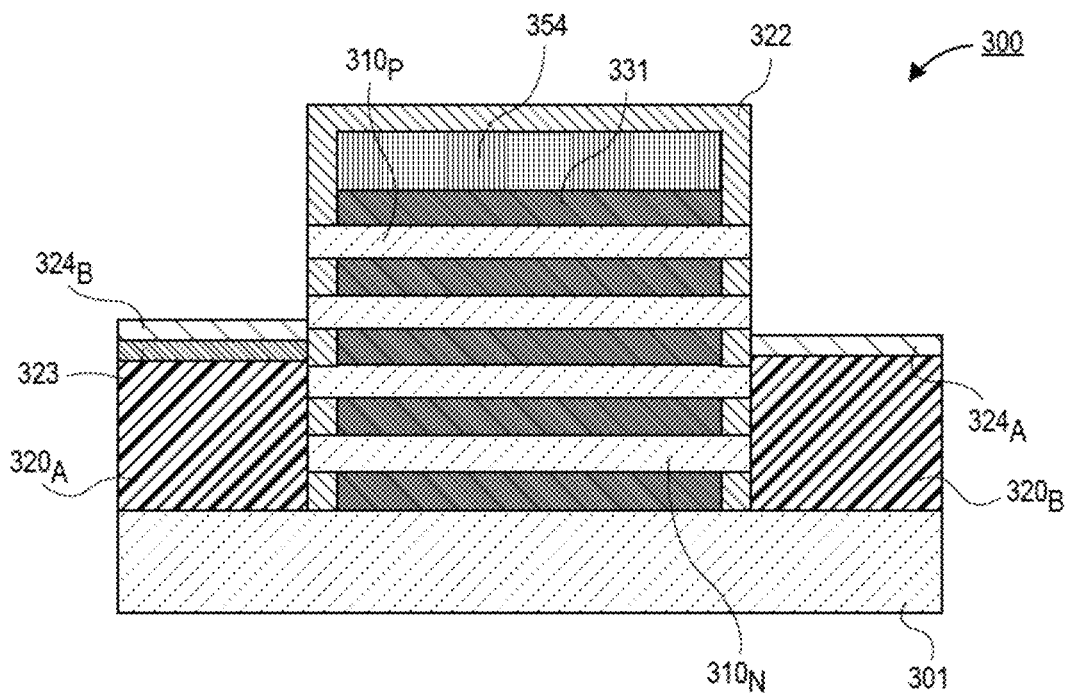
Figure 3P:
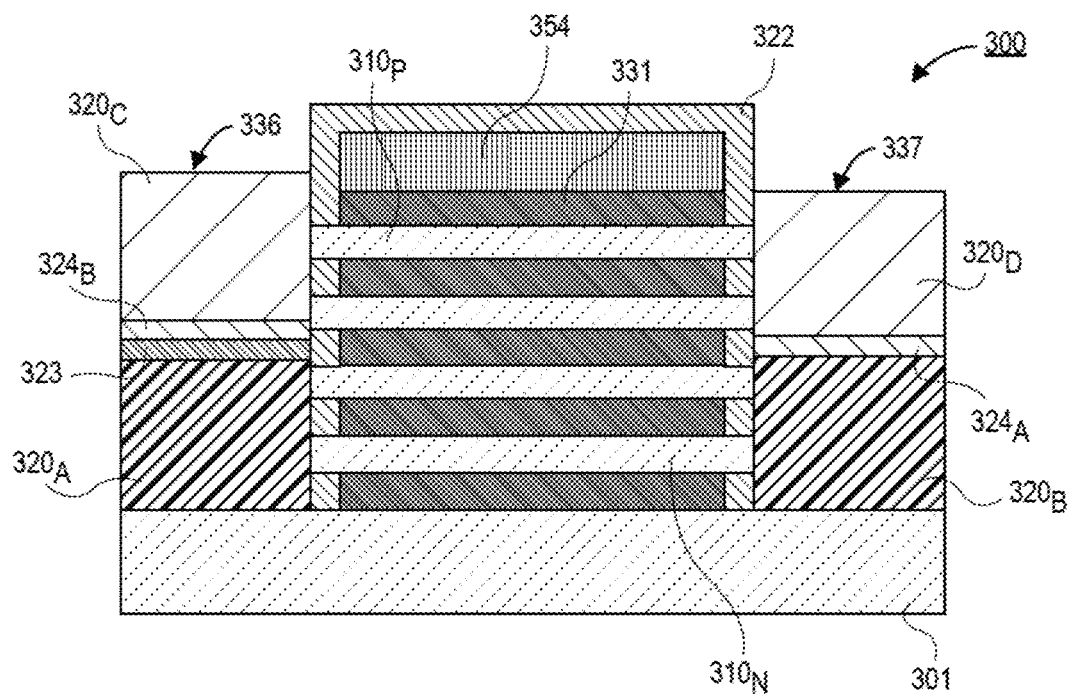
Figure 3Q:
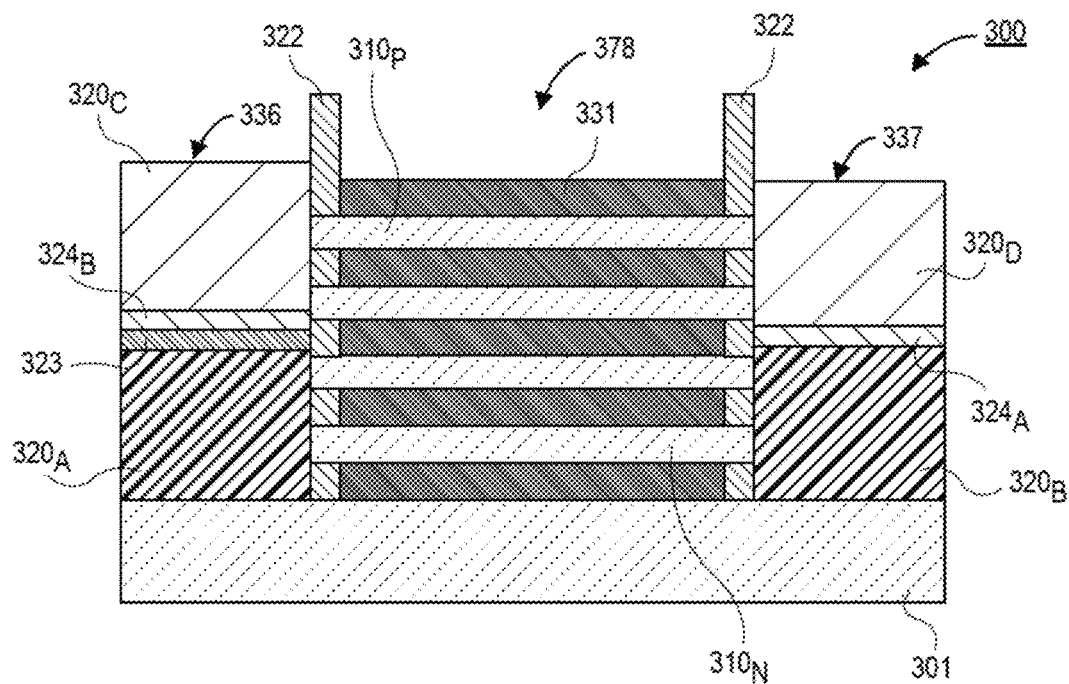
Figure 3R:
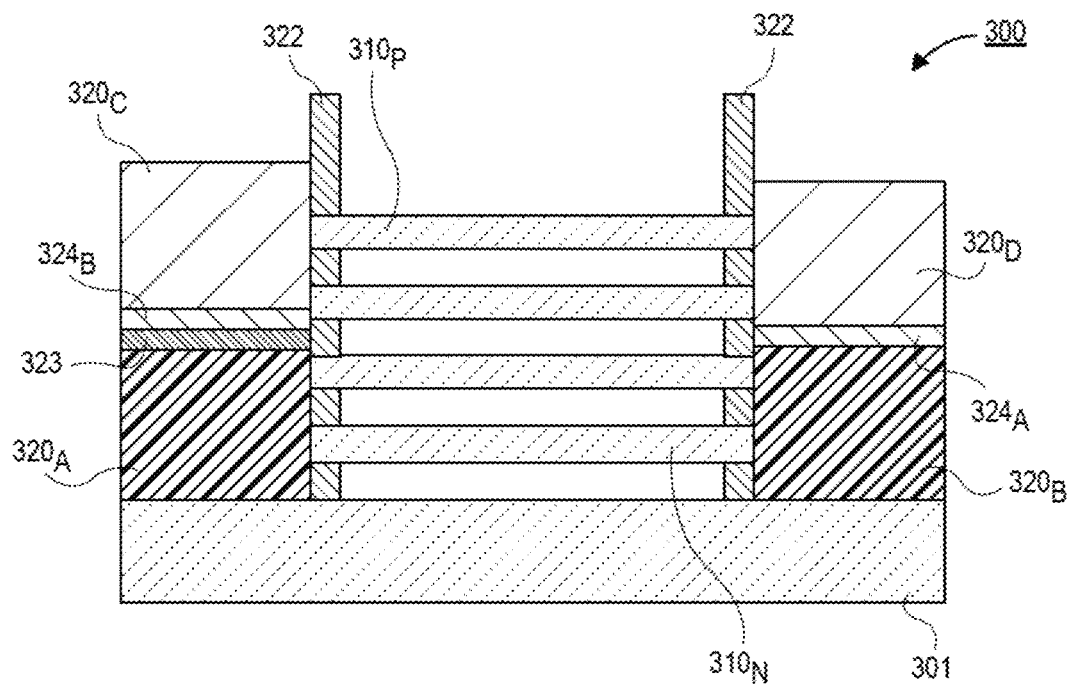
Figure 3S:
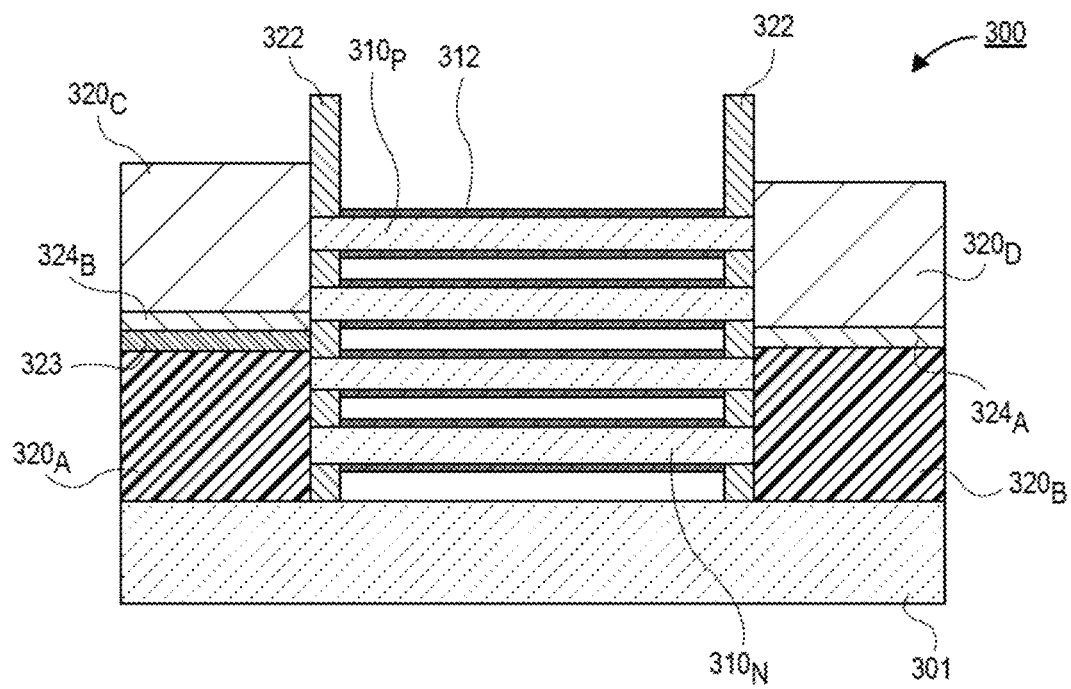
Figure 3T:
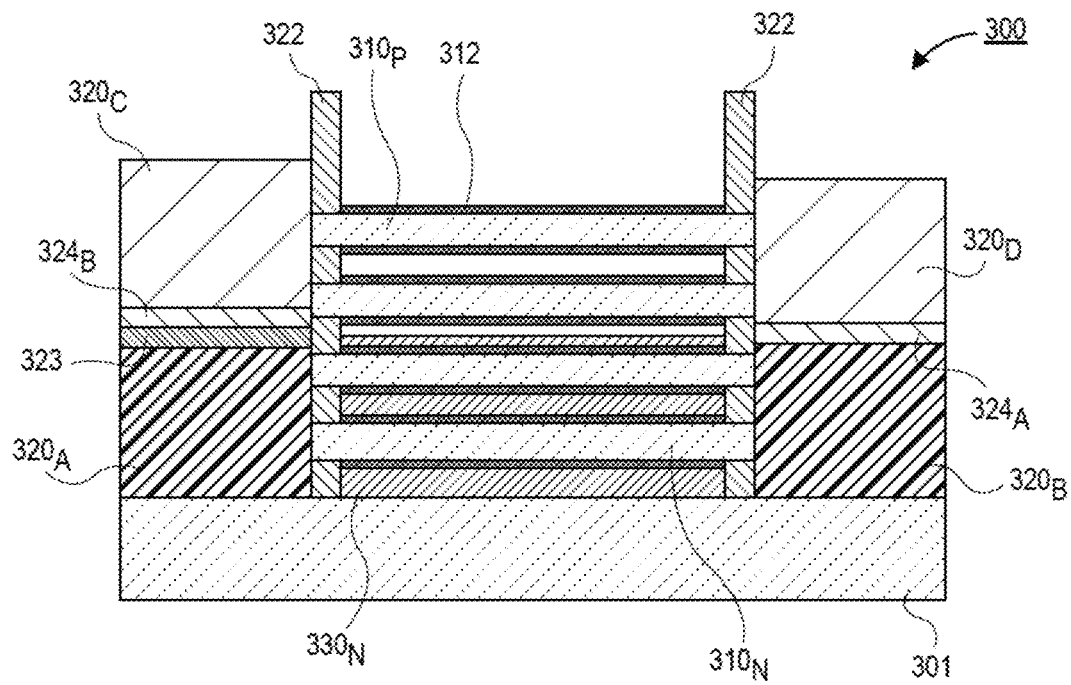
Figure 3U:
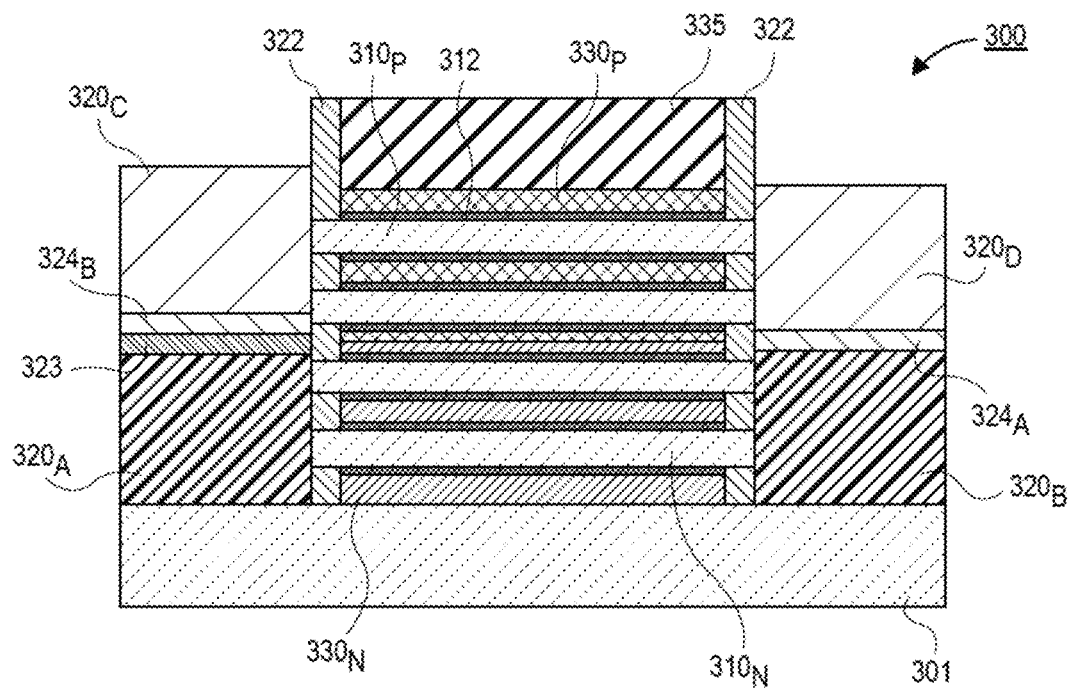

Referring now to FIGS. 3A-3U, a series of illustrations depicting a process for forming a semiconductor device 300 is shown, in accordance with an embodiment. The illustrated process flow depicts the process for forming a semiconductor device 300 that is similar to the semiconductor device 200 in FIG. 2E. However, it is to be appreciated that the other semiconductor devices disclosed herein may also be manufactured using similar processing operations with variations to one or more processing operations.

Referring now to FIG. 3A, a perspective view illustration of a semiconductor device 300 is shown, in accordance with an embodiment. The semiconductor device 300 may comprise a substrate 301. The substrate 301 may be similar to the substrates 201 described above. In an embodiment, a stack 350 of alternating channel layers 311 and sacrificial layers 331 is disposed over the substrate 301. In the illustrated embodiment, each of the channels layers 311 are uniformly spaced. However, in embodiments where non-uniform spacing is desired (e.g., similar to the device 200 in FIG. 2F), one or more of the sacrificial layers 331 may have a larger thickness. In the illustrated embodiment there are four channel layers 311. However, it is to be appreciated that there may be any number of channel layers 311 in the stack 350. In an embodiment, the topmost layer of the stack 350 is a sacrificial layer 331. In other embodiments, the topmost layer of the stack 350 may be a channel layer 311.

In an embodiment, the channel layers 311 are the material chosen for use as the semiconductor channels of the finished device. The channel layers 311 and sacrificial layers 331 may each be a material such as, but not limited to, silicon, germanium, SiGe, GaAs, InSb, GaP, GaSb, InAlAs, InGaAs, GaSbP, GaAsSb, and InP. In a specific embodiment, the channel layers 311 are silicon and the sacrificial layers 331 are SiGe. In another specific embodiment, the channel layers 311 are germanium, and the sacrificial layers 331 are SiGe.

The channel layers 311 and the sacrificial layers 331 may be grown with an epitaxial growth processes.

Referring now to FIG. 3B, a perspective view illustration of the semiconductor device 300 after a plurality of fins 308 are patterned is shown, in accordance with an embodiment. Each fin 308 may comprise a patterned stack 351. Each stack 351 comprises alternating semiconductor channels 310 and sacrificial layers 331.

Referring now to FIG. 3C, a cross-sectional illustration of the semiconductor device 300 in FIG. 3B along line 3-3 is shown, in accordance with an embodiment. As shown, the stack 351 comprises alternating semiconductor channels 310 and sacrificial layers 331 over the substrate 301.

Referring now to FIG. 3D, a cross-sectional illustration of the semiconductor device 300 after a sacrificial gate stack is disposed over the stack 351 is shown, in accordance with an embodiment. In an embodiment, the sacrificial gate stack may comprise a sacrificial gate 354 and a spacer 322 that surrounds the sacrificial gate 354. The perspective shown in FIG. 3D only illustrates the portion of the sacrificial gate 354 and spacer 322 over the top surface of the stack 351. FIG. 3E is a cross-sectional illustration of the semiconductor device 300 in FIG. 3D along line E-E'. As shown, the sacrificial gate 354 wraps down along the sidewalls of the stack 351.

Referring now to FIG. 3F, a cross-sectional illustration of the semiconductor device 300 after source/drain openings 341 are patterned into the stack 351 is shown, in accordance with an embodiment. The openings 341 are positioned outside of the sacrificial gate 354 and the spacers 322. In an embodiment, spacers 322 material may be disposed along end surfaces of the sacrificial layers 331. That is, portions of the semiconductor channels 310 pass through a thickness of the spacers 322, and the sacrificial layers 331 are laterally recessed and end at the interior surfaces of the spacers 322.

Referring now to FIG. 3G, a cross-sectional illustration of the semiconductor device 300 after first source/drain regions $320_A$ and $320_B$ are disposed into the openings 341. In an embodiment, the first source/drain regions $320_A$ and $320_B$ may be either conductivity type (e.g., P-type or N-type) source/drain material. In the particular embodiment described herein, the first source/drain regions $320_A$ and $320_B$ will be referred to as N-type source/drain regions $320_A$ and $320_B$. In an embodiment, the first source/drain regions $320_A$ and $320_B$ may be grown with an epitaxial growth process, and comprise materials such as those described above.

In an embodiment, the first source/drain regions $320_A$ and $320_B$ may have a thickness so that the first source/drain regions $320_A$ and $320_B$ each contact one or more semiconductor channels 310. Particularly, the first source/drain regions $320_A$ and $320_B$ in FIG. 3G contact the bottom two semiconductor channels 310. Since the bottom two semiconductor channels 310 are in contact with the N-type source/drain regions $320_A$ and $320_B$, they will be referred to as N-type semiconductor channels $310_N$. The top two semiconductor channels will be referred to as P-type semiconductor channels 310 since they will be contacted by P-type source/drain regions $320_C$ and $320_D$ in a subsequent processing operation.

Referring now to FIG. 3H, a cross-sectional illustration of the semiconductor device 300 after a resist layer 361 is disposed and patterned is shown, in accordance with an embodiment. In an embodiment, the resist layer 361 may be patterned with a lithographic process. The patterning may result in a top surface of the source/drain region $320_A$ being exposed, and the top surface of the source/drain region $320_B$ being covered.

Referring now to FIG. 3I, a cross-sectional illustration of the semiconductor device 300 after an insulating layer 323 is disposed over the exposed surfaces is shown, in accordance with an embodiment. In an embodiment, the insulating layer 323 may be an oxide, a nitride, or any other suitable insulating material. In an embodiment, the insulating layer 323 may be deposited with any suitable deposition process, such as chemical vapor deposition (CVD), physical vapor deposition (PVD), or the like. As shown, the insulating layer 323 is disposed over the top surface of the source/drain region $320_A$ and over the top surface of the resist layer 361.

Referring now to FIG. 3J, a cross-sectional illustration of the semiconductor device 300 after a second resist layer 362 is disposed over the insulating layer 323 is shown, in accordance with an embodiment. In an embodiment, the second resist layer 362 may be blanket deposited and recessed in order to expose the insulating layer 323 over the first resist 361 while still protecting the insulating layer 323 over the source/drain region $320_A$. Accordingly, the portion of the insulating layer 323 over the first resist 361 may be etched and removed without damaging the portion of the insulating layer 323 over the source/drain region $320_A$.

Referring now to FIG. 3K, a cross-sectional illustration of the semiconductor device 300 after portions of the insulating layer 323 are etched and the resist layers 361 and 362 are removed is shown, in accordance with an embodiment. Any suitable etching process selective to the insulating layer 323 may be used. In an embodiment, the resist layers 361 and 362 may be removed with an ashing process or the like. As shown, the resulting structure of device 300 includes first source/drain regions $320_A$ and $320_B$ where only one of the two source/drain regions $320_A$ and $320_B$ are covered by an insulating layer 323. Particularly, FIG. 3K shows source/drain region $320_A$ being covered by the insulating layer 323 and source/drain region $320_B$ having an exposed top surface.

Referring now to FIG. 3L, a cross-sectional illustration of the device 300 after a conducting layer 324 is disposed over the exposed surfaces is shown, in accordance with an embodiment. As shown, the conducting layer 324 may be blanket deposited. For example, a first portion of the conducting layer $324_A$ is deposited over the top surface of source/drain region $320_B$, a second portion of the conducting layer $324_B$ is deposited over the top surface of the insulating layer 323, and a third portion of the conducting layer $324_C$ is disposed over the spacer 322 and the sacrificial gate 354.

In an embodiment, the conducting layer 324 may be any suitable conductive material. For example, the conducting layer 324 may be TiN. In an embodiment, the conducting layer 324 is deposited with any suitable deposition process, such as PVD (e.g., sputtering), CVD, or the like.

Since the first portion of the conducting layer $324_A$ and the second portion of the conducting layer $324_B$ are deposited with the same process, the two layers will have substantially the same composition and thickness. However, since the insulating layer 323 is below the second portion of the conducting layer $324_B$, their Z-positions relative to a surface of the substrate 301 may be different. That is, the first portion of the conducting layer $324_A$ may be closer to the substrate 301 than the second portion of the conducting layer $324_B$.

Referring now to FIG. 3M, a cross-sectional illustration of the semiconductor device 300 after a third resist 363 is deposited and recessed is shown, in accordance with an embodiment. Recessing the third resist 363 exposes the third portion of the conducting layer $324_C$ while keeping the first portion of the conducting layer $324_A$ and the second portion of the conducting layer $324_B$ protected.

Referring now to FIG. 3N, a cross-sectional illustration of the semiconductor device 300 after the third portion of the conducting layer $324_C$ is removed is shown, in accordance with an embodiment. In an embodiment, the third portion of the conducting layer $324_C$ may be removed with any suitable etching process. As shown in FIG. 3O, the third resist 363 may then be removed with an ashing process, or the like. The resulting structure of the device 300 includes a first portion of the conducting layer $324_A$ over the source/drain region $320_B$, and a second portion of the conducting layer $324_B$ over the insulating layer 323. In some embodiments, the second portion of the conducting layer $324_B$ may be removed with additional processing operations. However, in other embodiments the second portion of the conducting layer $324_B$ may remain as a remnant of the process flow. As such, the presence of the second portion of the conducting layer $324_B$ may be used as an indicator that a particular process flow was used to make the semiconductor device 300.

Referring now to FIG. 3P, a cross-sectional illustration of the semiconductor device 300 after second source/drain regions $320_C$ and $320_D$ are formed is shown, in accordance with an embodiment. In an embodiment, the second source/drain regions $320_C$ and $320_D$ may be epitaxially grown. Materials and processes for growing the second source/drain regions $320_C$ and $320_D$ are similar to those described above with respect to the first source/drain regions $320_A$ and $320_B$. In an embodiment, the second source/drain regions $320_C$ and $320_D$ may each contact one or more semiconductor channels 310. For example, the second source/drain regions $320_C$ and $320_D$ contact two P-type semiconductor channels $310_P$. Due to being formed over different stacks of materials, the top surfaces of the second source/drain regions $320_C$ and $320_D$ may not be substantially coplanar. For example, a surface 336 of the source/drain region $320_C$ may be further from the substrate than a surface 337 of the source/drain region $320_D$.

Referring now to FIG. 3Q, a cross-sectional illustration of the semiconductor device 300 after the sacrificial gate 354 is removed is shown, in accordance with an embodiment. In an embodiment, the removal of the sacrificial gate 354 forms an opening 378 that exposes the sacrificial layers 331 remaining in the channel region between the spacers 322.

Referring now to FIG. 3R, a cross-sectional illustration of the semiconductor device 300 after the sacrificial layers 331 are removed is shown, in accordance with an embodiment. In an embodiment, the sacrificial layers 331 may be removed using any known etchant that is selective to semiconductor channels 310. In an embodiment, the selectivity is greater than 100:1. In an embodiment where semiconductor channels 310 are silicon and sacrificial layers 331 are silicon germanium, sacrificial layers 331 are selectively removed using a wet etchant such as, but not limited to, aqueous carboxylic acid/nitric acid/HF solution and aqueous citric acid/nitric acid/HF solution. In an embodiment where semiconductor channels 310 are germanium and sacrificial layers 331 are silicon germanium, sacrificial layers 331 are selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. In another embodiment, sacrificial layers 331 are removed by a combination of wet and dry etch processes.

Referring now to FIG. 3S, a cross-sectional illustration of the semiconductor device 300 after gate dielectric 312 is disposed over the semiconductor channels 310 is shown, in accordance with an embodiment. A single gate dielectric 312 is shown as being deposited over all semiconductor channels 310. However, in some embodiments, the N-type semiconductor channels $310_N$ may have a gate dielectric 312 that comprises different materials, thicknesses, or treatments than that of the gate dielectric 312 over the P-type semiconductor channels $310_P$. In the illustrated embodiment, the gate dielectric 312 is only shown over the semiconductor channels 310. However, other embodiments may include the deposition or growth of gate dielectric 312 over interior surfaces of the spacers 322 and/or over the substrate 301, similar to the gate dielectric 312 shown in FIG. 2F. In an embodiment, the gate dielectric 312 may be a thick gate dielectric 312 to support high-voltage applications. For example, the gate dielectric 312 may be thick enough to allow for the use of approximately 1.0 V or higher. In an embodiment, the gate dielectric 312 may have a thickness that is approximately 3 nm or greater.

Referring now to FIG. 3T, a cross-sectional illustration of the semiconductor device 300 after a first gate electrode $330_N$ is disposed over the N-type semiconductor channels $310_N$ is shown, in accordance with an embodiment. In an embodiment, the first gate electrode $330_N$ may be any suitable N-type work function metal, such as those described above. In an embodiment, the first gate electrode $330_N$ is deposited to a thickness so that a top surface of the first gate electrode $330_N$ is above the topmost N-type semiconductor channel $310_N$ and below the bottommost P-type semiconductor channel $310_P$.

Referring now to FIG. 3U, a cross-sectional illustration of the semiconductor device 300 after a second gate electrode 330 is disposed over the P-type semiconductor channels 310 is shown, in accordance with an embodiment. In an embodiment, the second gate electrode 330 may be any suitable P-type work function metal, such as those described above. In an embodiment, the second gate electrode 330 is deposited to a thickness so that a top surface of the second gate electrode 330 is above one or more P-type semiconductor channels $310_P$. As shown, the bottom surface of the second gate electrode 330 interfaces with the top surface of the first gate electrode $330_N$. In an embodiment, a fill metal 335 may be deposited above the second gate electrode $330_P$.

Figure 4:
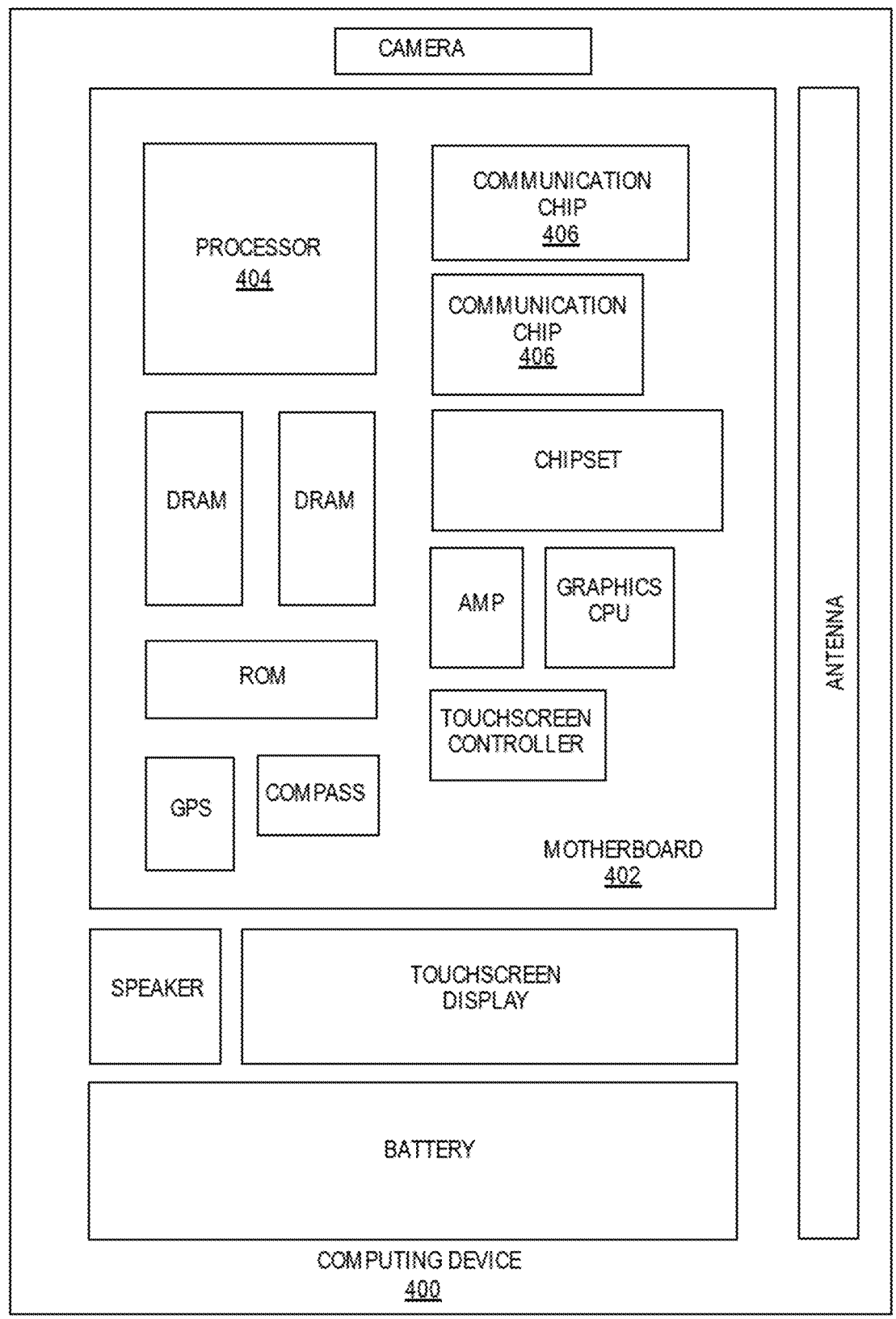
FIG. 4 illustrates a computing device in accordance with one implementation of an embodiment of the disclosure.

FIG. 4 illustrates a computing device 400 in accordance with one implementation of an embodiment of the disclosure. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In an embodiment, the integrated circuit die of the processor 404 may comprise an inverter comprising an N-type transistor and a P-type transistor that are stacked in a vertical orientation, as described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In an embodiment, the integrated circuit die of the communication chip 406 may comprise an inverter comprising an N-type transistor and a P-type transistor that are stacked in a vertical orientation, as described herein.

In further implementations, another component housed within the computing device 400 may comprise an inverter comprising an N-type transistor and a P-type transistor that are stacked in a vertical orientation, as described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
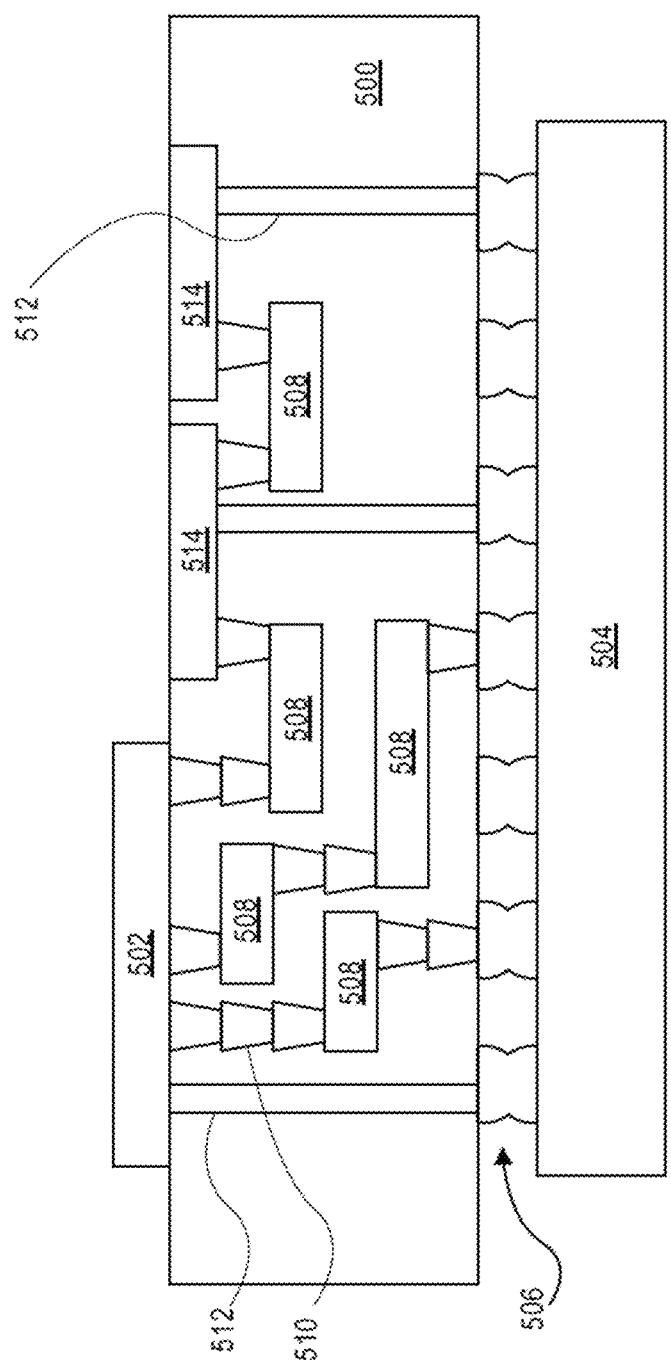
FIG. 5 is an interposer implementing one or more embodiments of the disclosure.

FIG. 5 illustrates an interposer 500 that includes one or more embodiments of the disclosure. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. In an embodiment, one of both of the first substrate 502 and the second substrate 504 may comprise an inverter comprising an N-type transistor and a P-type transistor that are stacked in a vertical orientation, in accordance with embodiments described herein. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the disclosure, apparatuses or processes disclosed herein may be used in the fabrication of interposer 500.

Thus, embodiments of the present disclosure may comprise semiconductor devices that comprise an inverter comprising an N-type transistor and a P-type transistor that are stacked in a vertical orientation, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a substrate; a first transistor of a first conductivity type over the substrate, the first transistor comprising: a first semiconductor channel; and a first gate electrode around the first semiconductor channel; and a second transistor of a second conductivity type above the first transistor, the second transistor comprising: a second semiconductor channel; and a second gate electrode around the second semiconductor channel, wherein the second gate electrode and the first gate electrode comprise different materials.

Example 2: the semiconductor device of Example 1, wherein first gate electrode directly contacts the second gate electrode between the first semiconductor channel and the second semiconductor channel.

Example 3: the semiconductor device of Example 1 or Example 2, wherein the first gate electrode is an N-type work function metal, and wherein the second gate electrode is a P-type work function metal.

Example 4: the semiconductor device of Examples 1-3, wherein the first transistor further comprises: a first source/drain region and a second source/drain region on opposite ends of the first semiconductor channel; and wherein the second transistor further comprises: a third source/drain region and a fourth source/drain region on opposite ends of the second semiconductor channel, wherein the third source/drain region is disposed over the first source/drain region, and wherein the fourth source/drain region is disposed over the second source/drain region.

Example 5: the semiconductor device of Example 4, further comprising: a conducting layer between the second source/drain region and the fourth source/drain region.

Example 6: the semiconductor device of Example 4 or Example 5, further comprising: an insulating layer between the first source/drain region and the third source/drain region.

Example 7: the semiconductor device of Example 6, further comprising: a conducting layer between the insulating layer and the third source/drain region.

Example 8: the semiconductor device of Examples 4-7, wherein a surface of the third source/drain region facing away from the substrate is a further from the substrate than a surface of the fourth source/drain region facing away from the substrate.

Example 9: the semiconductor device of Examples 4-8, wherein the first source/drain region is contacted by a via that passes through the substrate.

Example 10: the semiconductor device of Examples 4-8, wherein a width of the first source/drain region is greater than a width of the third source/drain region, and wherein a via that contacts the first source/drain region is laterally adjacent to the third source/drain region.

Example 11: the semiconductor device of Examples 1-10, wherein the first semiconductor channel and the second semiconductor channel are nanowires or nanoribbons.

Example 12: the semiconductor device of Examples 1-11, wherein the first transistor and the second transistor are electrically coupled together as an inverter.

Example 13: a semiconductor device, comprising: a substrate; a plurality of first semiconductor channels and a plurality of second semiconductor channels arranged in a vertical stack above the substrate; a first gate electrode surrounding the first semiconductor channels; and a second gate electrode surrounding the second semiconductor channels, wherein the second gate electrode and the first gate electrode comprise different materials, and wherein the first gate electrode directly contacts the second gate electrode.

Example 14: the semiconductor device of Example 13, wherein the first semiconductor channels are separated by a first spacing, the second semiconductor channels are separated by a second spacing, and a third spacing separates a topmost first semiconductor channel from a bottommost second semiconductor channel.

Example 15: the semiconductor device of Example 14, wherein the first spacing, the second spacing, and the third spacing are equal to each other.

Example 16: the semiconductor device of Example 14, wherein the third spacing is larger than the first spacing and the second spacing.

Example 17: the semiconductor device of Examples 13-16, further comprising: a first source/drain region and a second source/drain region on opposite ends of the first semiconductor channels; and a third source/drain region and a fourth source/drain region on opposite ends of the second semiconductor channels.

Example 18: the semiconductor device of Example 17, wherein the fourth source/drain region is electrically coupled to the second source/drain region by a conducting layer between the fourth source/drain region and the second source/drain region.

Example 19: the semiconductor device of Example 17 or Example 18, wherein the first source/drain region is electrically isolated from the third source/drain region by an insulating layer between the first source/drain region and the third source/drain region.

Example 20: a method of forming a semiconductor device, comprising: providing a fin comprising alternating channel layers and sacrificial layers; forming a first source/drain structure on a first end of the fin, wherein the first source/drain structure comprises: a first source/drain region; an insulating layer over the first source/drain region; and a second source/drain region over the insulating layer; forming a second source/drain structure on a second end of the fin, wherein the second source/drain structure comprises: a third source/drain region; a conducting layer over the third source/drain region; and a fourth source/drain region over the conducting layer; removing the sacrificial layers; disposing a first gate electrode over first channel layers; and disposing a second gate electrode over second channel layers above the first channel layers.

Example 21: the method of Example 20, wherein the first source/drain region and the third source/drain region are N-type, and the second source/drain region and the fourth source/drain region are P-type.

Example 22: the method of Example 21, wherein the first gate electrode is an N-type work function material, and wherein the second gate electrode is a P-type work function material.

Example 23: an electronic device comprising: a board; an electronic package electrically coupled to the board; and a die electrically coupled to the electronic package, wherein the die comprises: a substrate; a plurality of first semiconductor channels and a plurality of second semiconductor channels arranged in a vertical stack above the substrate; a first gate electrode surrounding the first semiconductor channels; and a second gate electrode surrounding the second semiconductor channels, wherein the second gate electrode and the first gate electrode comprise different materials.

Example 24: the electronic device of Example 23, wherein the first semiconductor channels and the second semiconductor channels are part of an inverter.

Example 25: the electronic device of Example 23 or Example 24, wherein the die further comprises: a first source/drain region and a second source/drain region on opposite ends of the first semiconductor channels; and a third source/drain region and a fourth source/drain region on opposite ends of the second semiconductor channels.

What is claimed is:

1. A semiconductor device, comprising:
a substrate;
a plurality of first semiconductor channels and a plurality of second semiconductor channels arranged in a vertical stack above the substrate;
a first gate electrode surrounding the first semiconductor channels;
a first gate dielectric between the first gate electrode and the first semiconductor channels, the first gate dielectric having a first composition;
a second gate electrode surrounding the second semiconductor channels; and
a second gate dielectric between the second gate electrode and the second semiconductor channels, wherein the second gate dielectric has a second composition different than the first composition.

2. The semiconductor device of claim 1, wherein the first gate electrode directly contacts the second gate electrode.

3. The semiconductor device of claim 1, wherein the second gate electrode and the first gate electrode comprise different materials.

4. The semiconductor device of claim 1, wherein the first semiconductor channels are separated by a first spacing, the second semiconductor channels are separated by a second spacing, and a third spacing separates a topmost first semiconductor channel from a bottommost second semiconductor channel.

5. The semiconductor device of claim 4, wherein the first spacing, the second spacing, and the third spacing are equal to each other.

6. The semiconductor device of claim 1, wherein the second gate dielectric has a thickness different than a thickness of the first gate dielectric.

7. The semiconductor device of claim 1, further comprising:
a first source or drain region and a second source or drain region on opposite ends of the first semiconductor channels; and
a third source or drain region and a fourth source or drain region on opposite ends of the second semiconductor channels.

8. The semiconductor device of claim 7, wherein the fourth source or drain region is electrically coupled to the second source or drain region by a conducting layer between the fourth source or drain region and the second source or drain region.

9. The semiconductor device of claim 7, wherein the first source or drain region is electrically isolated from the third source or drain region by an insulating layer between the first source or drain region and the third source or drain region.

10. A semiconductor device, comprising:
a substrate;
a first transistor of a first conductivity type over the substrate, the first transistor comprising:
a first semiconductor channel;
a first gate electrode around the first semiconductor channel;
a first gate dielectric between the first gate electrode and the first semiconductor channel, the first gate dielectric having a first composition; and
a second transistor of a second conductivity type above the first transistor, the second transistor comprising:
a second semiconductor channel;
a second gate electrode around the second semiconductor channel; and
a second gate dielectric between the second gate electrode and the second semiconductor channel, wherein the second gate dielectric has a second composition different than the first composition.

11. The semiconductor device of claim 10, wherein the first gate electrode directly contacts the second gate electrode between the first semiconductor channel and the second semiconductor channel.

12. The semiconductor device of claim 10, wherein the first gate electrode is an N-type work function metal, and wherein the second gate electrode is a P-type work function metal.

13. The semiconductor device of claim 10,
wherein the first transistor further comprises:
a first source or drain region and a second source or drain region on opposite ends of the first semiconductor channel; and wherein the second transistor further comprises:
    a third source or drain region and a fourth source or drain region on opposite ends of the second semiconductor channel, wherein the third source or drain region is disposed over the first source/drain region, and wherein the fourth source or drain region is disposed over the second source or drain region.

14. The semiconductor device of claim 13, further comprising:
    a conducting layer between the second source or drain region and the fourth source or drain region.

15. The semiconductor device of claim 13, further comprising:
    an insulating layer between the first source/drain region and the third source/drain region.

16. The semiconductor device of claim 15, further comprising:
    a conducting layer between the insulating layer and the third source/drain region.

17. The semiconductor device of claim 13, wherein a surface of the third source or drain region facing away from the substrate is a further from the substrate than a surface of the fourth source or drain region facing away from the substrate.

18. The semiconductor device of claim 13, wherein the first source or drain region is contacted by a via that passes through the substrate.

19. An electronic device comprising:
a board;
an electronic package electrically coupled to the board; and
a die electrically coupled to the electronic package, wherein the die comprises:
    a substrate;
    a plurality of first semiconductor channels and a plurality of second semiconductor channels arranged in a vertical stack above the substrate;
    a first gate electrode surrounding the first semiconductor channels;
    a first gate dielectric between the first gate electrode and the first semiconductor channels, the first gate dielectric having a first composition;
    a second gate electrode surrounding the second semiconductor channels; and
    a second gate dielectric between the second gate electrode and the second semiconductor channels, wherein the second gate dielectric has a second composition different than the first composition.

20. The electronic device of claim 19, wherein the first semiconductor channels and the second semiconductor channels are part of an inverter.

\* \* \* \* \*